US005789950A

United States Patent [19]

Nakagawa

[11] Patent Number: 5,789,950

[45] Date of Patent: Aug. 4, 1998

[54] DIRECT DIGITAL SYNTHESIZER

[75] Inventor: Tadao Nakagawa, Yokosuka, Japan

[73] Assignee: Nippon Telegraph and Telephone Corporation, Tokyo, Japan

[21] Appl. No.: 649,315

[22] Filed: May 17, 1996

[30] Foreign Application Priority Data

May 22, 1995 [JP] Japan .................................... 7-122103
Jul. 12, 1995 [JP] Japan .................................... 7-176324

[51] Int. Cl.[6] .............................. H03B 19/14; H03K 5/13

[52] U.S. Cl. .......................... 327/105; 327/107; 327/141; 327/114; 364/721

[58] Field of Search .................................... 327/105, 106, 327/107, 114, 115, 141, 113; 364/721

[56] References Cited

U.S. PATENT DOCUMENTS 4,328,554 5/1982 Mantione ................................ 327/107
4,340,863 7/1982 Scordo .................................... 327/115

FOREIGN PATENT DOCUMENTS 404048823A 2/1992 Japan .................................... 327/105
001392613A1 4/1988 U.S.S.R. ................................ 327/105

OTHER PUBLICATIONS

Create signals having optimum resolution, response, and noise, Earl McCune, Jr., Digital RF Solutions Corp.; EDN, vol. 36, No. 6, pp. 95–108, Mar. 1991.

A Short Survey of Frequency Synthesizer Techniques, V. Reinhardt, et al; Proc. 40th Annual Frequency Control Symposium, pp. 355–365, May 1986.

"A DDS with analog interpolation circuits", Nakagawa et al, Proceedings of the 1996 Institute of Electronics Information and Communication Engineers (IEICE) conference, Mar. 29, 1996, p. 306 (in Japanese).

*Primary Examiner*—Timothy P. Callahan
*Assistant Examiner*—Dinh Le
*Attorney, Agent, or Firm*—Frishauf, Holtz, Goodman, Langer & Chick, P.C.

[57] ABSTRACT

A direct digital synthesizer capable of generating a desired frequency with small circuitry, low power consumption, and no spurious components. It includes an accumulator for accumulating a frequency control word for each pulse of a clock signal, a D/A converter for converting the accumulation value of the accumulator to an analog voltage, an integrator for smoothing the output of the D/A converter, a comparator for comparing the output of the integrator with a reference voltage, and for producing pulses at timings at which the output of the integrator reaches the reference voltage while the accumulation value of the accumulator is increasing, and a pulse generator for producing pulses in synchronism with the rising edges of the output of the comparator. The output pulses of the pulse generator constitute an output of the direct digital synthesizer.

14 Claims, 27 Drawing Sheets

DIRECT DIGITAL SYNTHESIZER

BACKGROUND OF THE INVENTION

1. Field of the Invention

The present invention relates to a direct digital synthesizer capable of generating a desired frequency signal, and particularly to a frequency synthesizer that can produce high frequency signal of good spurious characteristics at low power consumption.

2. Description of Related Art

An example of conventional direct digital synthesizer is disclosed, for example, in Ref. 1 by V. Reinhardt, K. Gould, K. McNab, and M. Bustamante, "A SHORT SURVEY OF FREQUENCY SYNTHESIZER TECHNIQUES", in Proc. 40th Annual Frequency Control Symposium, May 1986, pp. 355–365, or in Ref. 2 by E. McCune Jr. "Create signals having optimum resolution, response, and noise", EDN, Vol. 36, No. 6, pp. 95–108, March 1991.

FIG. 1 shows the configuration of such a conventional example. In this figure, reference numeral 1 designates an accumulator, 32 designates a ROM (read-only memory), 2 designates a D/A converter, 33 designates a lowpass filter, 6 designates a data input terminal, 7 designates a clock input terminal, and 8 designates an output terminal.

The accumulator 1 receives a frequency control word, and accumulates it each time a clock pulse is input. Assuming that the accumulator 1 is an n-bit accumulator, it continues the accumulation, when the accumulation value exceeds $2^n$, from its initial value equal to an excess of the accumulation value over its accumulation limit. The accumulation value of the accumulator 1 is used as address data of the ROM 32. The ROM 32 stores digital data of a sine wave, and outputs sine wave data in response to the address data. The sine wave data is converted to an analog signal by the D/A converter 2. The analog signal, a staircase waveform varying at a clock frequency, is smoothed by the lowpass filter 33. Thus, a synthesizer output is obtained whose frequency is given by the following equation.

$$f_{out}=K/2^n \cdot f_{CLK} \quad (1)$$

where $f_{CLK}$ is the clock frequency, and K is the frequency control word. Since this type of direct digital synthesizer does not use a feedback loop as a PLL (Phase-Locked Loop), it can realize a high frequency resolution and high speed transition of the output frequency.

Another conventional example of a direct digital synthesizer, which is also disclosed in the foregoing Refs. 1 and 2, obtains an output from the MSB (Most Significant Bit) of the accumulator 1. It provides a rectangular wave signal with a frequency given by equation (1), and a lowpass filter is used to convert the rectangular wave signal to a sine wave.

The foregoing conventional direct digital synthesizer using a ROM has a problem in that the data access time of the ROM is rather long, and this hinders the frequency of the synthesizer from being increased. In addition, it presents another problem in that it has large size and great power consumption.

On the other hand, the direct digital synthesizer which produces the output at the MSB of the accumulator has a problem in that it generates in principle large spurious components (unnecessary waves) when the frequency control word K is not $2^m$ where m is an integer, and hence the output pulse width varies periodically.

SUMMARY OF THE INVENTION

It is therefore an object of the present invention is to provide a direct digital synthesizer which can obviate the ROM, and reduce the periodical frequency variation to zero in principle, thereby eliminating the foregoing problems.

According to the present invention, there is provided a direct digital synthesizer comprising:

an accumulator for accumulating a frequency control word K each time a clock pulse is input, the accumulator continuing accumulation of the frequency control word K, when its accumulation value overflows, by setting an excess of the accumulation value over an accumulation limit of the accumulator as an initial value of the accumulator;

a signal generator for generating a signal indicative of an average increasing rate of the accumulation value of the accumulator;

a comparator for comparing an output of the signal generator with a reference voltage determined in advance; and a pulse generator for generating a pulse in synchronism with one of a rising edge and a falling edge of an output pulse of the comparator.

Here, the signal generator may comprise a D/A converter for converting the accumulation value of the accumulator to an analog signal, and an integrator for smoothing an output of the D/A converter.

The signal generator may comprise a differential signal generator for producing a signal corresponding to a difference between a current output of the accumulator and a one clock preceding output of the accumulator, and an integrator for integrating an output of the differential signal generator.

The differential signal generator may comprise a D/A converter for converting the accumulation value of the accumulator to an analog signal, a delay circuit for delaying an output of the D/A converter, and a differential amplifier to which the output of the D/A converter and an output of the delay circuit are input.

The differential signal generator may comprise a first D/A converter for converting the accumulation value of the accumulator to an analog signal, a delay flip-flop for delaying the accumulation value of the accumulator by one clock interval of the clock signal, a second D/A converter for converting an output of the delay flip-flop into an analog signal, and a differential amplifier to which an output of the first D/A converter and an output of the second D/A converter are input.

The differential amplifier and the integrator may be incorporated into a differential integrator.

The differential signal generator may comprise a delay flip-flop for delaying the accumulation value of the accumulator by one clock interval of the clock signal, a full subtractor for obtaining a difference between the accumulation value of the accumulator and an output of the delay flip-flop, and a D/A converter for converting an output of the full subtractor to an analog signal.

The accumulator may be an n-bit accumulator which produces an overflow signal when the accumulation value grows equal to or greater than $2^n$, and the signal generator may comprise a differential signal generator for switching a voltage proportional to the frequency control word K and a voltage proportional to $K-2^n$ to produce one of them in response to a level of the overflow signal of the accumulator, and an integrator for time integrating an output of the differential signal generator.

The differential signal generator may comprise:

a D/A converter for converting the frequency control word K to an analog signal;

a level converter for converting the level of the overflow signal of the accumulator such that a DC (direct current) level of an output of the level converter becomes equal, when the overflow signal is high, to a DC level of an output of the D/A converter to which data $2^n$ is input, and becomes equal, when the overflow signal is low, to the DC level of the output of the D/A converter to which data 0 is input; and a differential amplifier to which the output of the D/A converter and an output of the level converter are input.

The differential signal generator may comprise:

a data selector for switching data corresponding to $2^n$ and data corresponding to 0 to produce one of them in response to the level of the overflow signal of the accumulator;

a full subtractor for producing a difference between output data of the data selector and the frequency control word K; and a D/A converter for converting an output of the full subtractor to an analog signal.

The differential signal generator may comprise:

an A/D converter for producing one of data corresponding to $2^n$ and data corresponding to 0 in response to the level of the overflow signal of the accumulator;

a full subtractor for producing a difference between output data of the A/D converter and the frequency control word K; and a D/A converter for converting an output of the full subtractor to an analog signal.

The direct digital synthesizer may further comprise an amplitude converter connected between the accumulator and the A/D converter for converting the level of the overflow signal of the accumulator.

The direct digital synthesizer may further comprise an inverter whose input is connected to the clock signal and whose output is connected to a clock input terminal of the A/D converter.

The pulse generator may comprise a toggle flip-flop.

The pulse generator may comprise a one-shot multivibrator.

The main feature of the present invention is to extract timings at which a signal indicating the average increasing rate of the accumulation value coincides with the reference voltage, while the accumulation value is increasing of the n-bit accumulator for accumulating the frequency control word K each time the clock pulse is input, and to produce a pulse train on the basis of the timings. It differs from the prior art in that it can generate a desired frequency signal without using a ROM, and reduce the periodic frequency variation to zero in principle.

In this embodiment, a principle is used that the signal indicating the average increasing rate of the accumulation value of the accumulator agrees with a sawtooth wave including no frequency variations when the accumulation value is increasing. Since the synthesizer output is obtained by thus utilizing such time axis information associated with the increasing accumulation value of the accumulator, it can prevent the spurious components from being produced owing to the periodical frequency variations.

The above and other objects, effects, features and advantages of the present invention will become more apparent from the following description of the embodiments thereof taken in conjunction with the accompanying drawings.

DETAILED DESCRIPTION OF PREFERRED EMBODIMENTS

The invention will now be described with reference to the accompanying drawings.

EMBODIMENT 1

Figure 2:
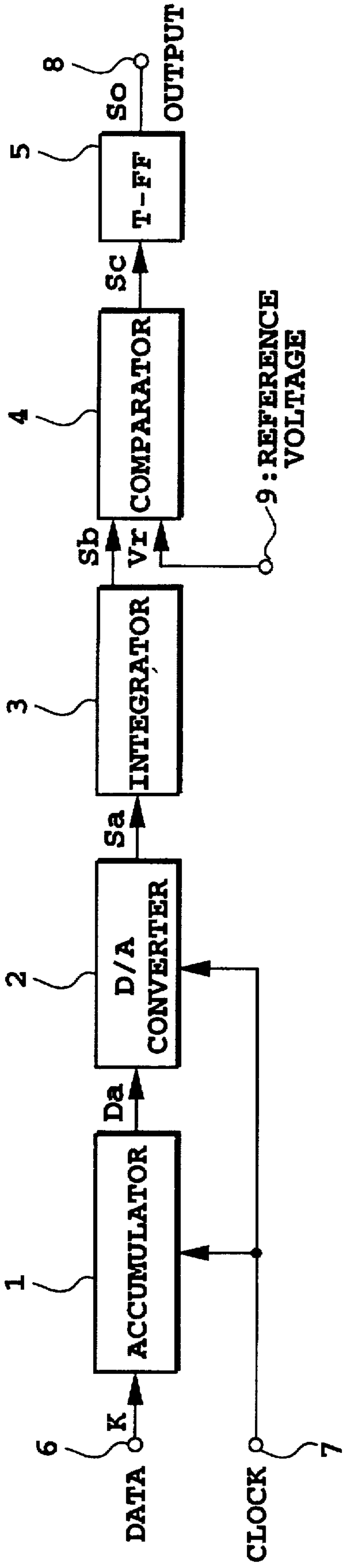
FIG. 2 is a block diagram showing a first embodiment of the direct digital synthesizer in accordance with the present invention.

FIG. 2 is a block diagram showing a first embodiment of the direct digital synthesizer in accordance with the present invention.

In FIG. 2, the reference numeral 1 designates an accumulator, 2 designates a D/A converter, 3 designates an integrator for smoothing an input signal, 4 designates a comparator, 5 designates a toggle flip-flop (T-FF), 6 designates an input terminal of a frequency control word K, 7 designates an input terminal of a clock signal, 8 designates an output terminal, and 9 designates an input terminal of a reference voltage Vr to the comparator.

FIGS. 3A, 3B, 4A and 4B are timing diagrams illustrating the operation of the embodiment. The operation of the first embodiment will now be described with reference to these figures.

Assuming that the accumulator 1 is a 3-bit accumulator, the overflow occurs at $2^n=8$. In addition, assuming that the frequency control word K is three, the content of the accumulator 1 is increased such as 3 and 6 each time the clock pulse is input. The next clock would change the content to 9. This, however, is not realized because the overflow occurs, and the accumulator 1 continues the accumulation from the initial value 1 obtained by subtracting 8 from 9.

Figure 3A:
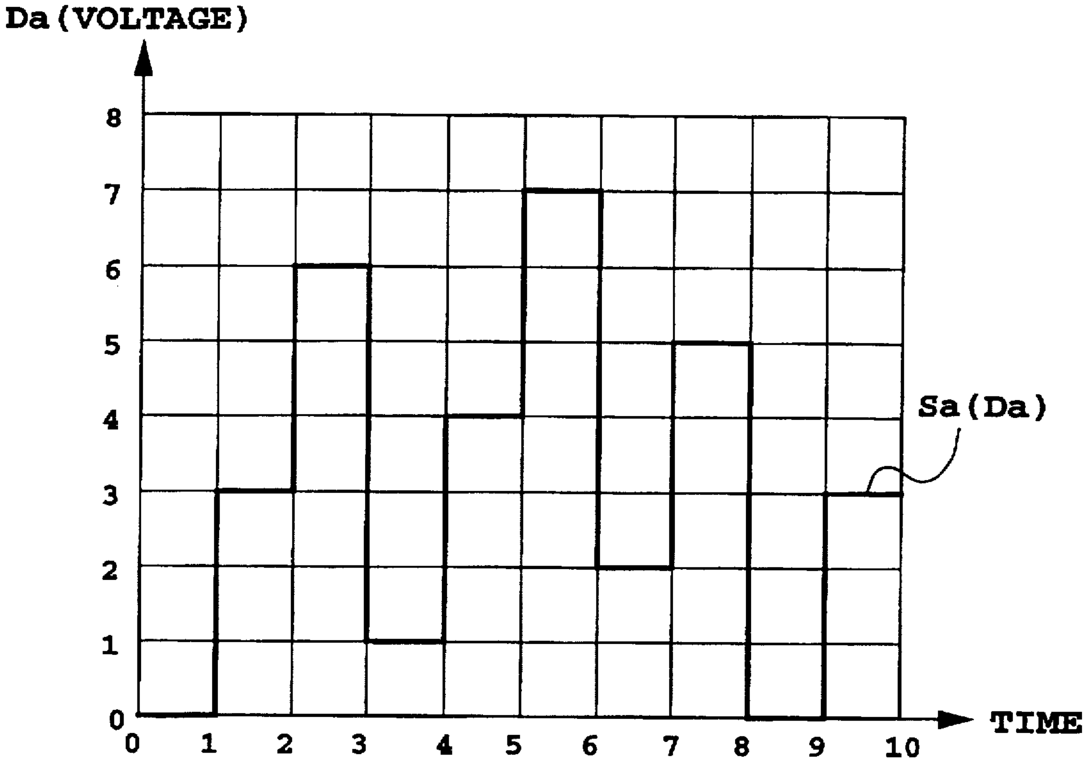
FIG. 3A is a waveform chart illustrating the output Sa of the D/A converter in FIG. 2.

The digital output Da of the accumulator 1 is converted to an analog voltage by the D/A converter 2, thereby resulting in a staircase waveform Sa as shown in FIG. 3A. In FIG. 3A, the axis of abscissas represents clock periods, and the axis of ordinates represents the resolution of the accumulator 1 in terms of voltages.

The staircase waveform Sa is quantized on the axis of ordinates in terms of voltages, and its pulse width periodically varies on the axis of abscissas in terms of time, thereby resulting in large spurious components.

Figure 3B:
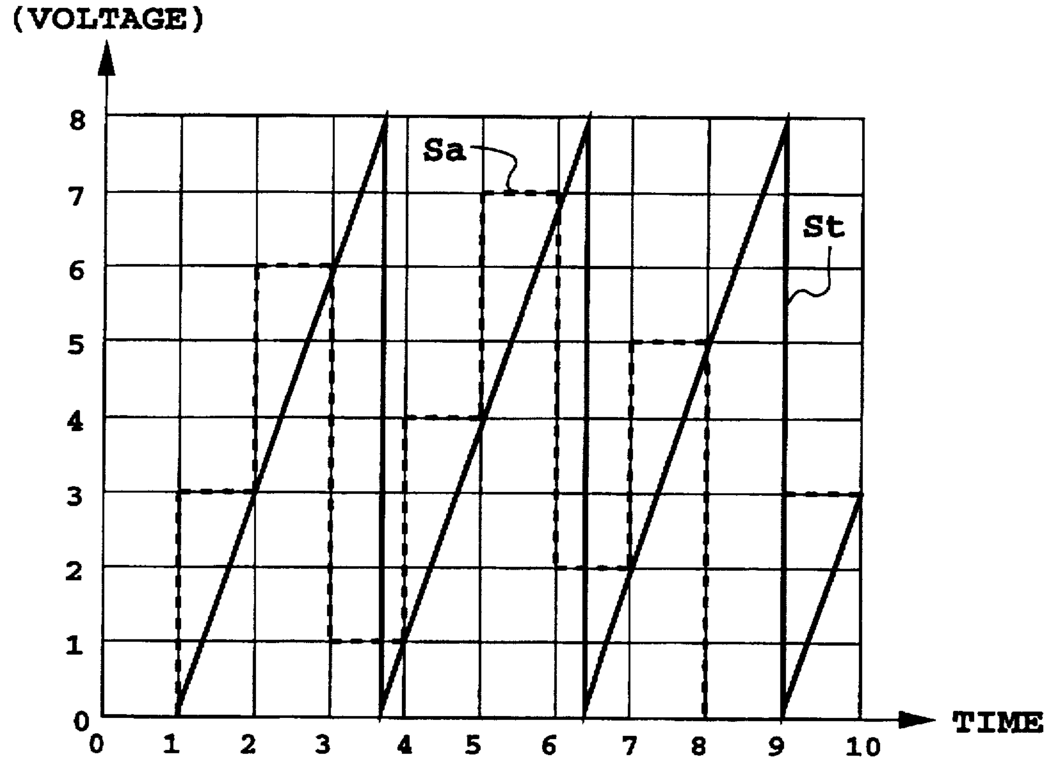
FIG. 3B is a waveform chart illustrating an imaginary sawtooth wave St obtained from the signal Sa in FIG. 3A.

It should be noticed that the staircase waveform Sa varies along an imaginary sawtooth waveform St depicted by solid lines in FIG. 3B. The sawtooth waveform St is obtained by linking with a line the values of the staircase waveform Sa at clock pulse input timings, by extrapolating the line, and by returning the line to zero at timings when the line intersects the voltage line corresponding to $2^3=8$.

The sawtooth waveform St includes three waves per eight clock periods, each having equal width on the time axis. This means that the sawtooth waveform St includes only the fundamental frequency represented by the foregoing equation (1) and its harmonics, thereby excluding any other spurious components.

In this embodiment, the output Sa of the D/A converter 2 is smoothed by the integrator 3. The output Sb of the integrator 3 is shown by the solid lines in FIG. 4A, in which the broken lines show the output Sa of the D/A converter 2. Comparing the solid lines of FIG. 4A with the imaginary sawtooth waveform St of FIG. 3B, we find that they coincide with each other while the accumulation value of the accumulator 1 is increasing.

Accordingly, a signal without the spurious component can be obtained by utilizing the time axis information while the output Sb of the integrator 3 is increasing. Since the time constant of the integrator 3 is independent of the output frequency of the synthesizer, it is sufficient that the time constant is decided only by the clock period.

To utilize the time axis information while the output Sb of the integrator 3 is increasing, the present embodiment employs the comparator 4 and the T-FF 5 as shown in FIG. 2. The output Sc of the comparator 4 is shown in FIG. 4B when the reference voltage is set at voltage 4 in FIG. 4A, for example.

Although the signal Sc varies its pulse width periodically, and hence includes spurious components, the rising edges of the pulses occur at a fixed time interval. This is because the rising timings of the waveform as shown in FIG. 4B are equal to those obtained by comparing the imaginary sawtooth waveform St with the voltage 4 in FIG. 3B.

The T-FF 5 is a logic circuit (bistable multivibrator) that inverts its level each time the rising edge (or falling edge) of a pulse is applied. Thus, if the T-FF 5 operates at the rising edge of a pulse, the signal So output from the output terminal 8 of FIG. 2 will take a waveform as shown in FIG. 4C. The output is a rectangular wave with a duty ratio of 50%, and includes only frequency components associated with the fundamental wave and its harmonics without any other spurious components. The frequency of the fundamental wave is half the frequency given by equation (1).

When a circuit connected to the output terminal 8 is a digital circuit, the rectangular wave can be used without change. Alternatively, the fundamental wave can be extracted with a lowpass filter as needed, or the harmonics can be extracted with a bandpass filter. In addition, the frequency can be varied by changing the frequency control word K.

When the output Sc of the comparator 4 differs from (is reversed over) that as shown in FIG. 4B, a T-FF operating at a falling edge should be used as the T-FF 5. In any case, the T-FF 5 must reverse its state at the timings at which the increasing accumulation value of the accumulator 1 reaches the reference voltage Vr.

As described above, the present embodiment can generate a desired frequency signal without using a ROM, and can eliminate the periodic frequency variations in principle.

Figure 5A:
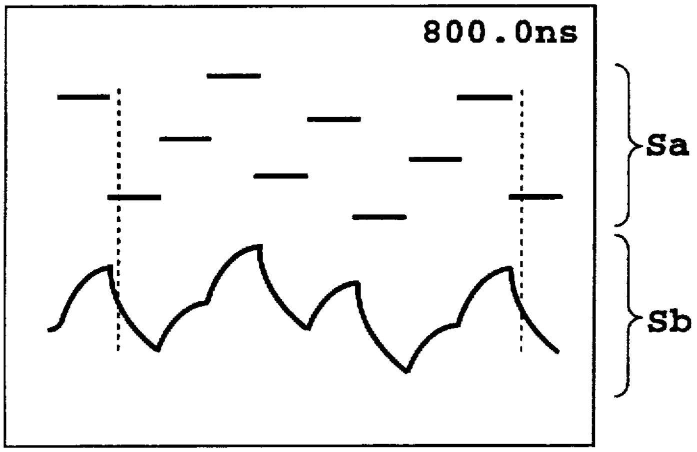
FIG. 5A is a waveform chart illustrating the output Sa of the D/A converter 2 and the output Sb of the integrator 3 in FIG. 2.
Figure 5B:
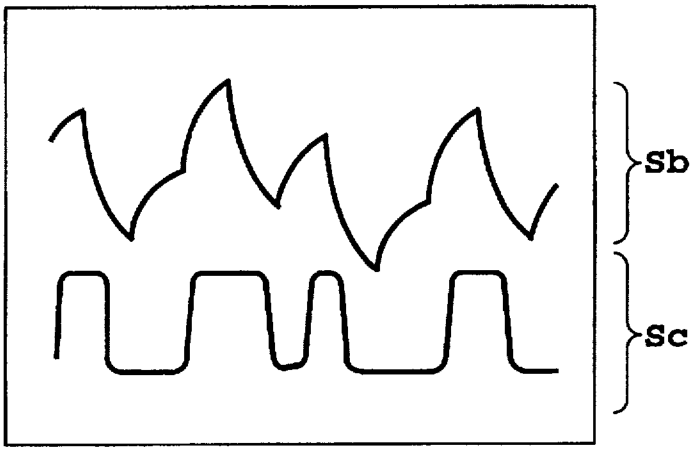
FIG. 5B is a waveform chart illustrating the output Sb of the integrator 3 and the output Sc of the comparator 4 in FIG. 2.
Figure 5C:
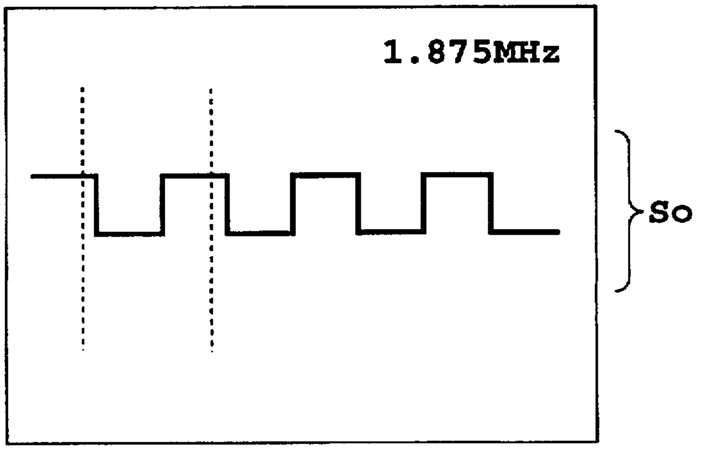
FIG. 5C is a waveform chart illustrating the output So of the T-FF 5 in FIG. 2.
Figure 6A:
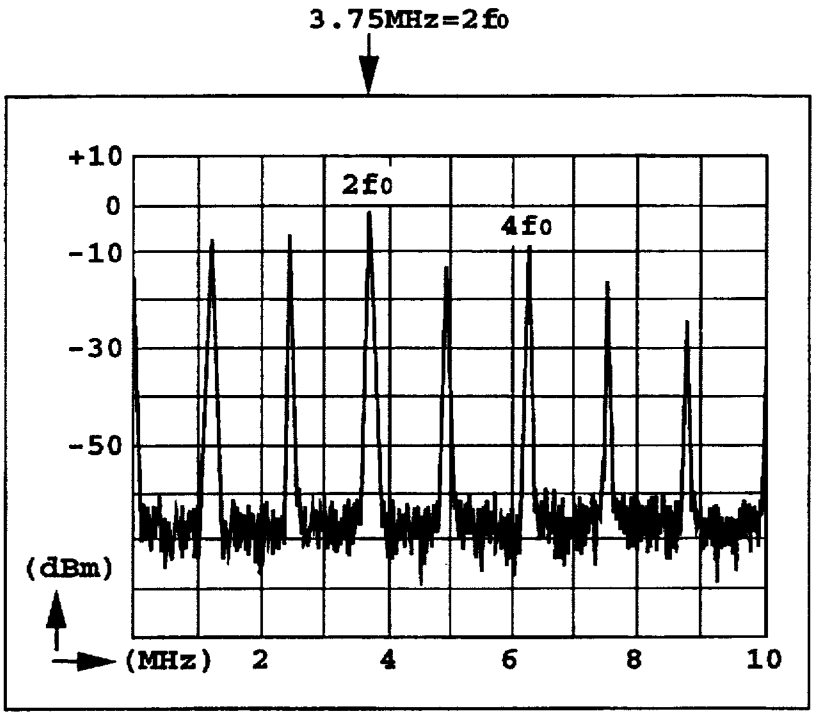
FIG. 6A is a diagram illustrating a spectrum of the output Sa of the D/A converter 2 in FIG. 2.
Figure 6B:
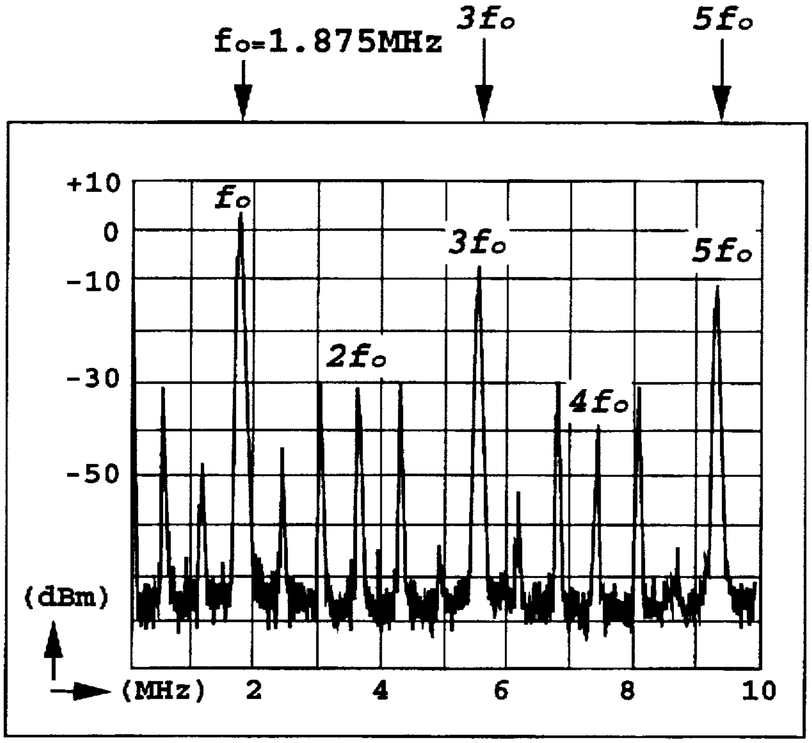
FIGS. 6B and 7 are diagrams illustrating spectrums of the output So of the T-FF 5 in FIG. 2.
Figure 7:
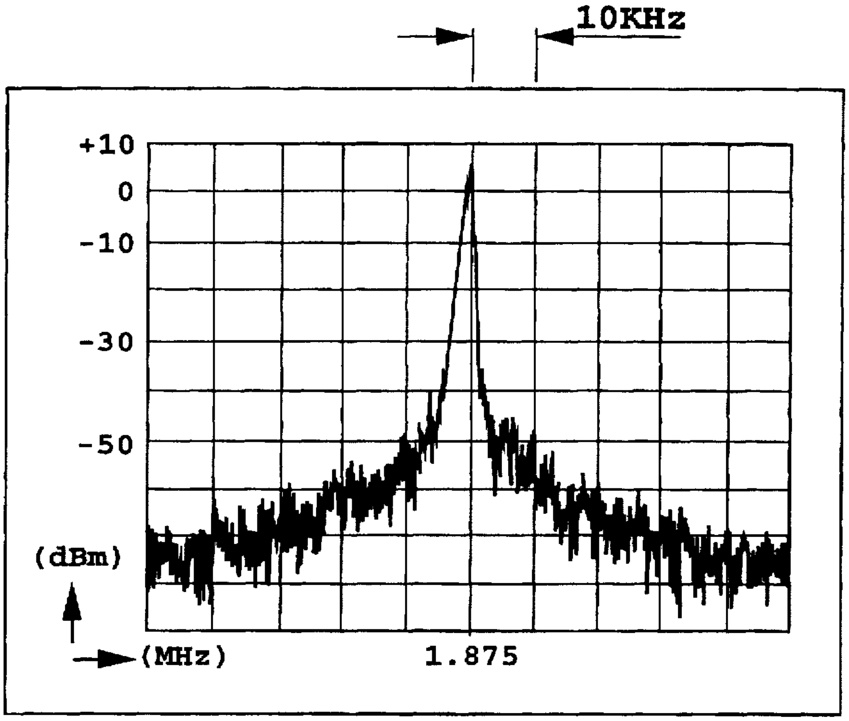

FIGS. 5A–7 show results of an experiment carried out using a direct digital synthesizer of the first embodiment in accordance with the present invention, wherein FIGS. 5A–5C show waveforms observed on an oscilloscope, and FIGS. 6A, 6B and 7 show spectra observed on a spectrum analyzer. Two vertical lines in FIG. 5A indicate that the interval therebetween is 800 ns, and two vertical lines in FIG. 5C indicate that the interval therebetween is one period of 1.875 MHz.

In these figures, the clock frequency $F_{CLK}$ is 10 MHz, the accumulator 1 is 15 bits, and the frequency control word K is $2^{12}\times3$. Accordingly, the output Sa of the D/A converter 2 includes a frequency component as expressed by the following equation (2), and other spurious components.

$$f_{out} = K/2^n \cdot f_{CLK} = 2^{12} \times 3/2^{15} \cdot 10 = 3/8 \cdot 10 = 3.75\ (\mathrm{MH_z}) \quad (2)$$

The output Sa of the D/A converter 2 takes a staircase waveform as shown in FIG. 5A, and its spectrum, which includes a desired wave of 3.75 MHz and spurious components, is shown in FIG. 6A. The level difference between the desired wave and the spurious components is about 5 dB. The output of the D/A converter 2 is smoothed by the integrator 3 which outputs the waveform Sb as shown in FIG. 5A. The integrator 3 is an incomplete integrator consisting of only a capacitor and a resistor.

The output of the integrator 3 is compared with the reference voltage Vr by the comparator 4 which produces the output Sc as shown in FIG. 5B. This shows that the pulse width changes periodically. The output Sc is input to the T-FF 5 operating at the rising edge of pulses. The output So of the T-FF 5 is a rectangular wave with a duty ratio of 50% as shown in FIG. 5C, and its spectrum is shown in FIGS. 6B and 7.

As shown in FIGS. 6B and 7, the spurious components are greatly reduced by an amount of 30 dB or more with respect to the fundamental wave except for the odd-order harmonics and the fundamental wave itself with a frequency of 1.875 MHz, that is, half the frequency given by equation (2).

These measured results show that the direct digital synthesizer in accordance with the present invention can generate a desire frequency without a ROM, and reduce the spurious components caused by the periodic frequency variation.

EMBODIMENT 2

Figure 8:
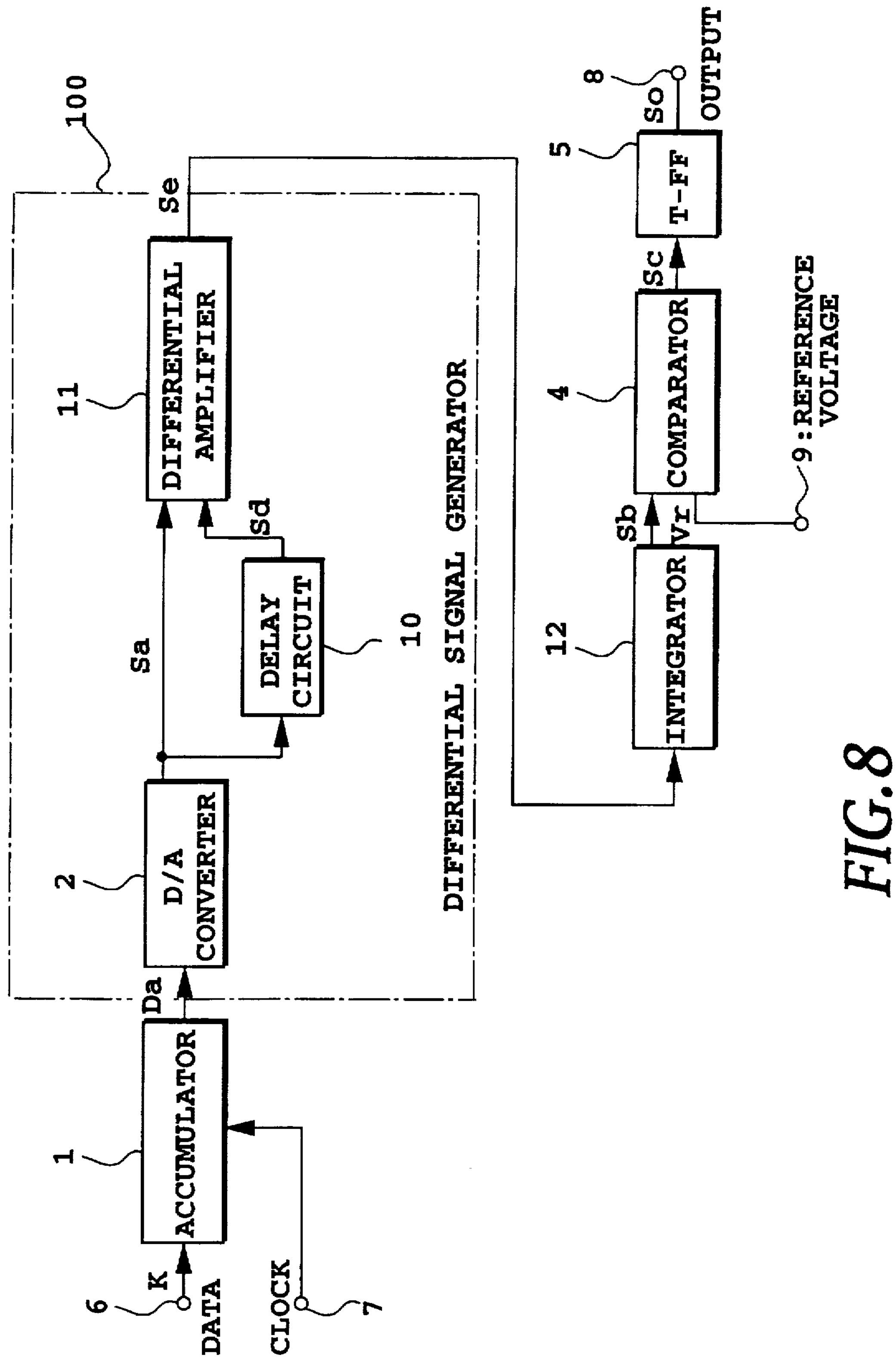
FIG. 8 is a block diagram showing a second embodiment of the direct digital synthesizer in accordance with the present invention.

FIG. 8 is a block diagram showing a second embodiment of the direct digital synthesizer in accordance with the present invention. The second embodiment differs from the first embodiment in that it employs a complete integrator 12 instead of the incomplete integrator 3, and that a delay circuit 10 and a differential amplifier 11 are connected between the D/A converter 2 and the integrator 12. The output Sa of the D/A converter 2 is fed to a first input terminal of the differential amplifier 11, and the delay circuit 10. The delay circuit 10 delays the signal Sa by one clock period, and supplies the delayed signal Sd to a second input terminal of the differential amplifier 11. The output Se of the differential amplifier 11 is fed to the integrator 12. The D/A converter 2, the delay circuit 10 and the differential amplifier 11 constitute a differential signal generator 100.

Figure 9A:
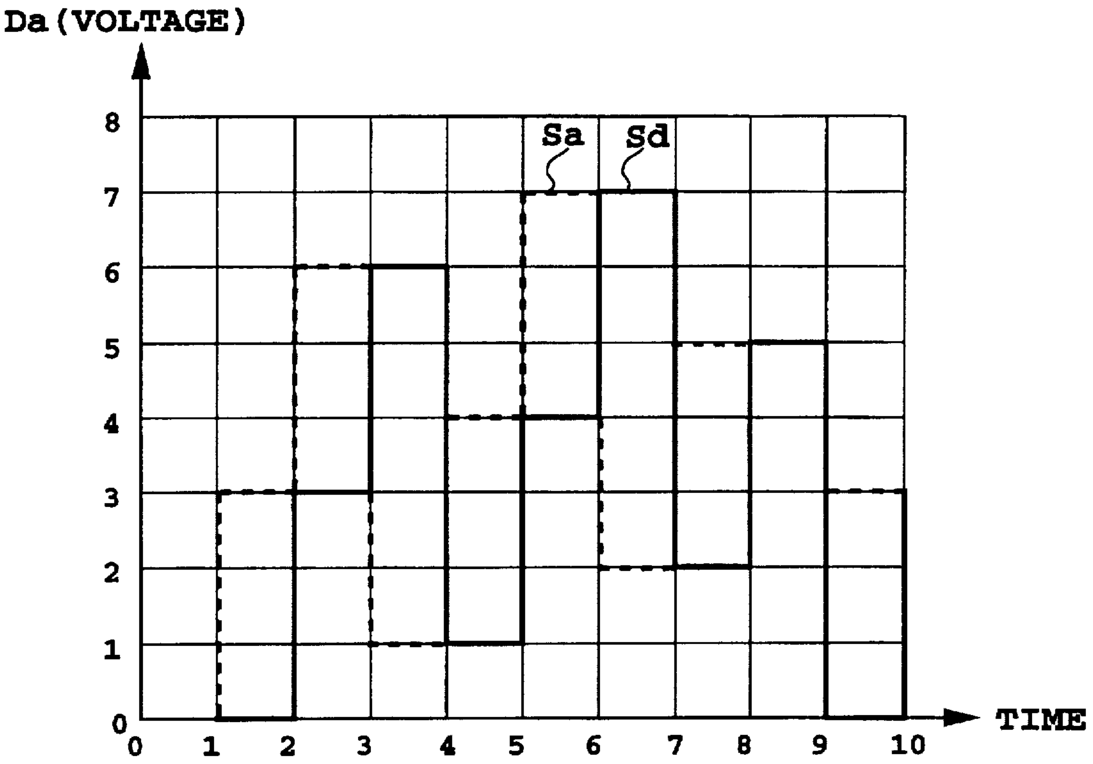
FIG. 9A is a waveform chart illustrating the output Sd of the delay circuit 10 in FIG. 8.
Figure 9B:
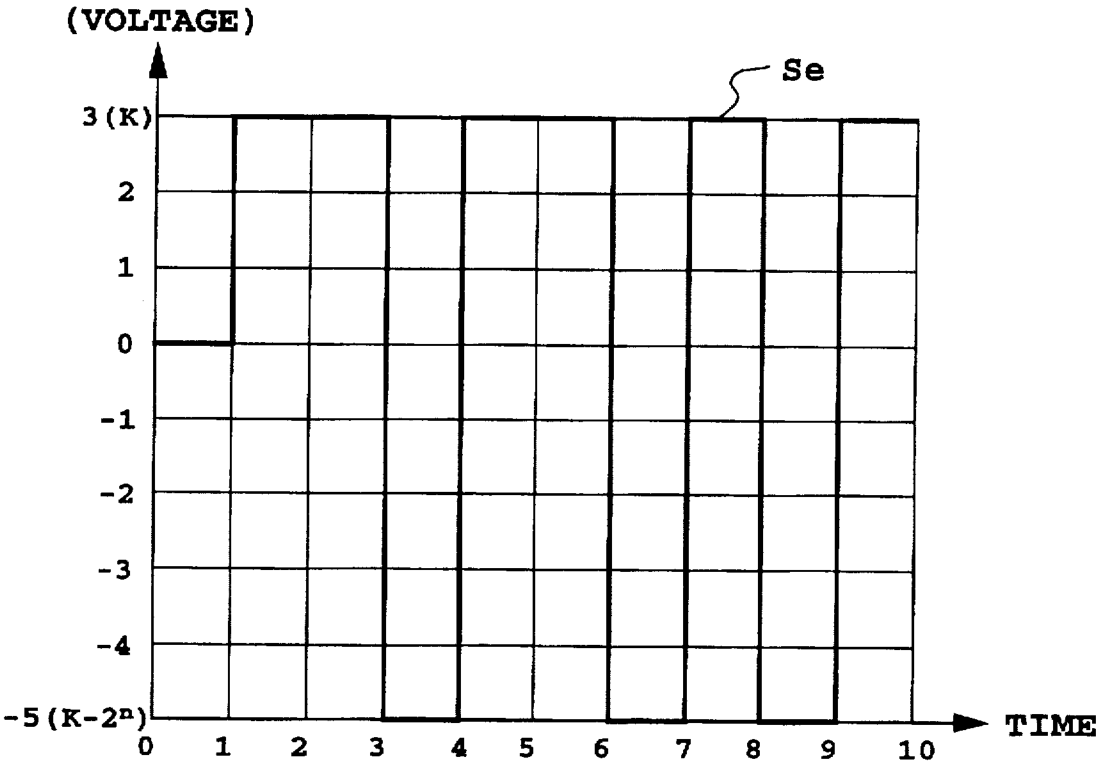
FIG. 9B is a waveform chart of the output Se of the differential amplifier 11 in FIG. 8.

FIG. 9A shows the signal Sd output from the delay circuit 10 with the solid lines and the signal Sa with the broken lines. The differential amplifier 11 outputs the difference of the two signals. FIG. 9B shows the output Se of the differential amplifier 11 with an amplification factor of unity. As shown in this figure, the signal Se periodically alternates its voltages between the frequency control word K=3, and $K-2^n$.

Figure 1:
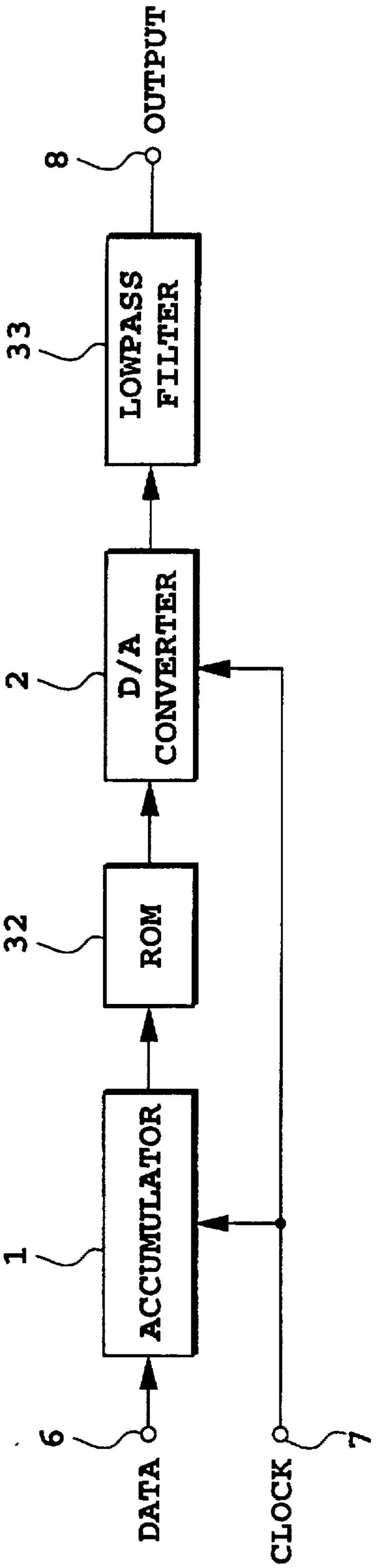
FIG. 1 (PRIOR ART)
FIG. 1 is a block diagram showing a conventional example of a direct digital synthesizer.
Figure 4A:
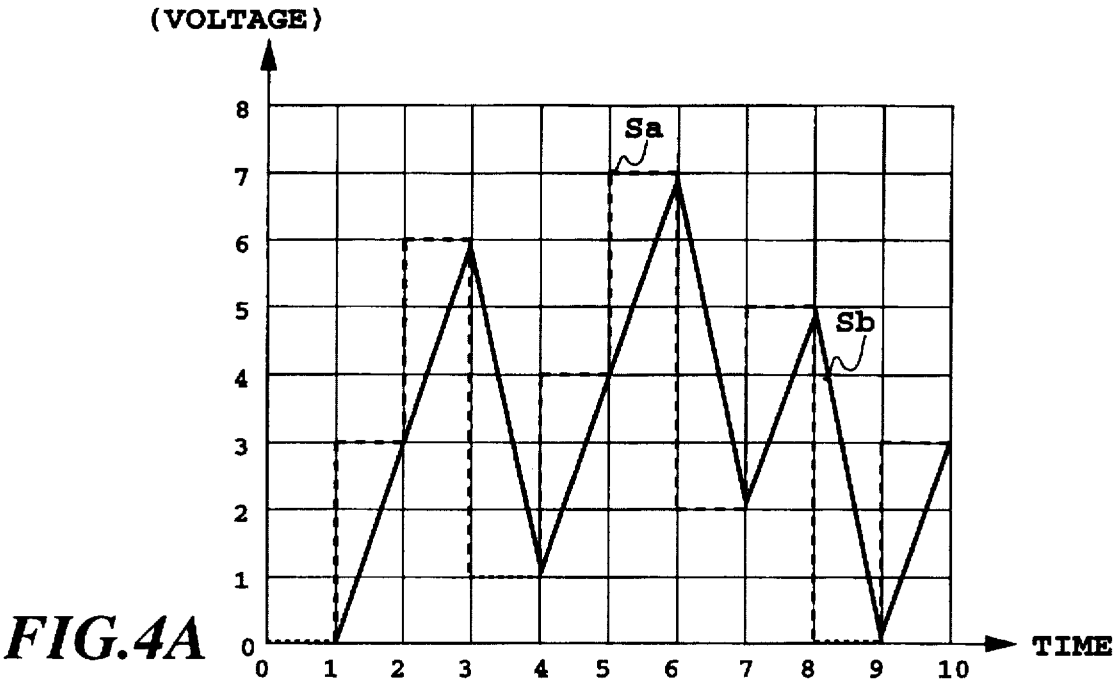
FIG. 4A is a waveform chart illustrating the output Sb of the integrator 3 in FIG. 2.
Figure 4B:
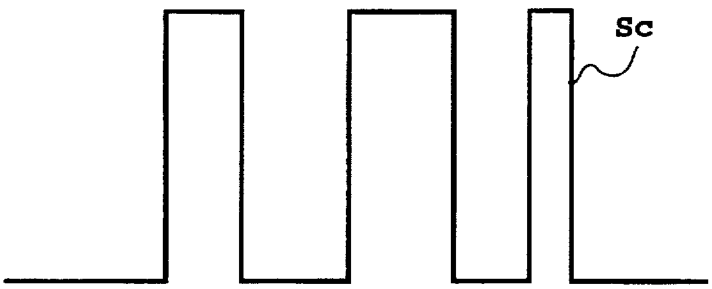
FIG. 4B is a waveform chart illustrating the output Sc of the comparator 4 in FIG. 2.
Figure 4C:
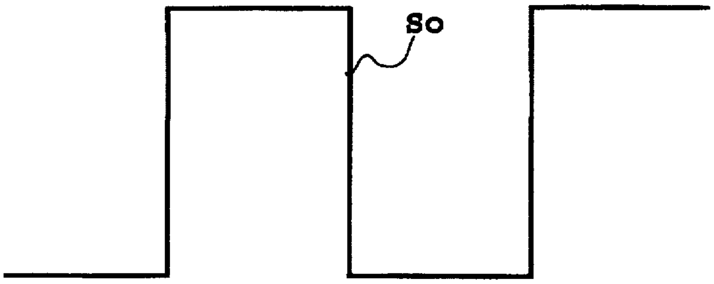
FIG. 4C is a waveform chart illustrating the output So of the T-FF 5 in FIG. 2.

The integrator 12 carries out integration of the signal Se over one clock period, and outputs a signal Sb as shown in FIG. 4A. The time constant of the integrator 12 is set such that an integral of voltage 1 is obtained when a fixed voltage 1 is integrated for a time 1. Therefore, the integration of the fixed voltage 3 from time 1 to 3 in FIG. 9B results in 6 at time 3 of FIG. 4B, and 1 at the next time 4 because −5 is added to this value 6.

Thus, the integrator 12 outputs a waveform similar to that of the first embodiment. Accordingly, a desired frequency can be obtained by the same configuration and operation as that of the first embodiment after the integrator 12.

Incidentally, the integrator 3 of the first embodiment is an incomplete integrator consisting of a resistor and a capacitor. On the other hand, the integrator 12 of the second embodiment is a complete integrator comprising a resistor, capacitor and an operational amplifier. As a result, the second embodiment is more accurate than the first embodiment. It should be noticed, however, that the difference in the accuracy is not shown in FIG. 4A because it illustrates the output waveforms of the integrators 3 and 12 only schematically.

Although the differential amplifier 11 and the integrator 12 are separated as shown in FIG. 8 in the second embodiment, they can be integrated into one circuit.

Figure 10:
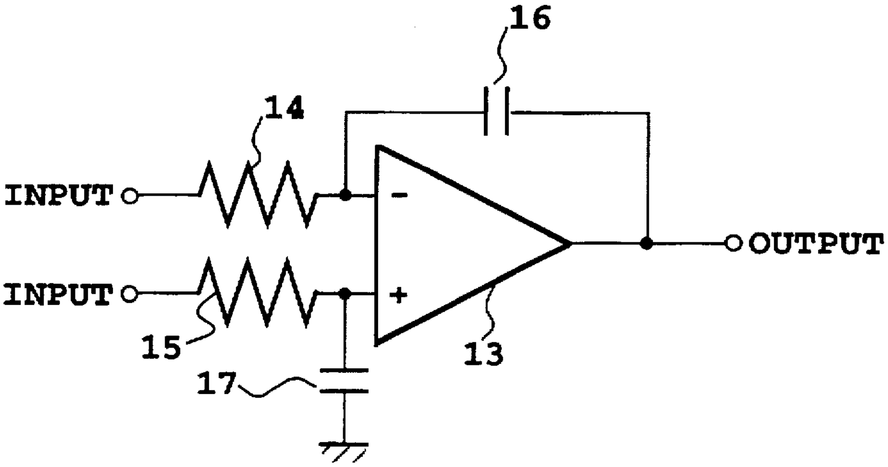
FIG. 10 is a circuit diagram showing a differential integrator incorporating the differential amplifier 11 and the integrator 12 in FIG. 8.

FIG. 10 shows an example of such a circuit. In FIG. 10, the reference numeral 13 designates an operational amplifier, 14 and 15 designate resistors, and 16 and 17 designate capacitors. The differential integrator integrates the difference across the two input terminals to produce the integral of the difference. Accordingly, its input terminals are connected to the output terminal of the D/A converter 2 and that of the delay circuit 10, respectively, and its output terminal is connected to the input terminal of the comparator 4.

EMBODIMENT 3

Figure 11:
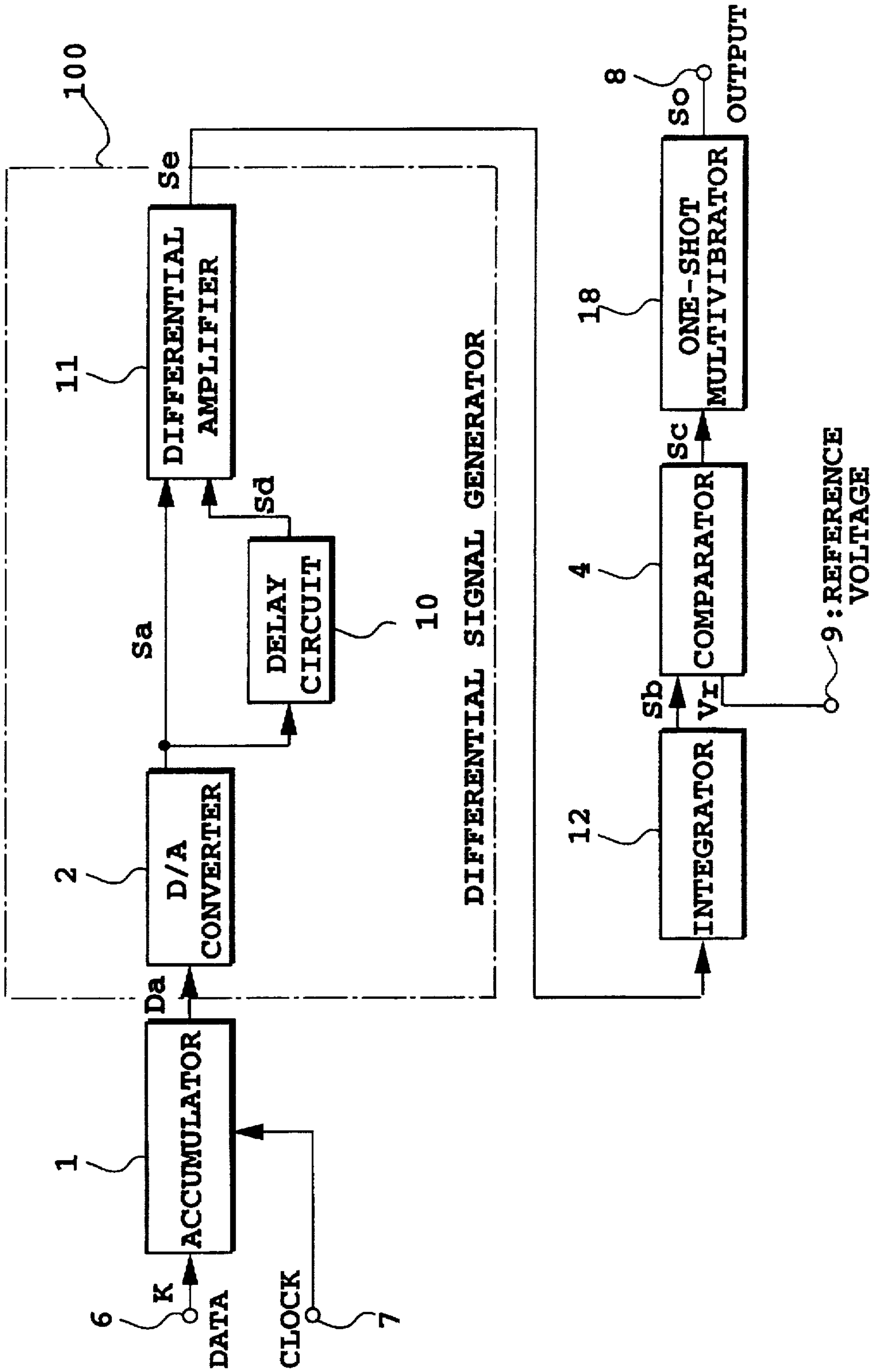
FIG. 11 is a block diagram showing a third embodiment of the direct digital synthesizer in accordance with the present invention.

FIG. 11 is a block diagram showing a third embodiment of the direct digital synthesizer in accordance with the present invention. In FIG. 11, the reference numeral 11 designates a one-shot multivibrator (monostable multivibrator), and the other reference numerals designate the same portions as those in FIG. 8.

Figure 12A:
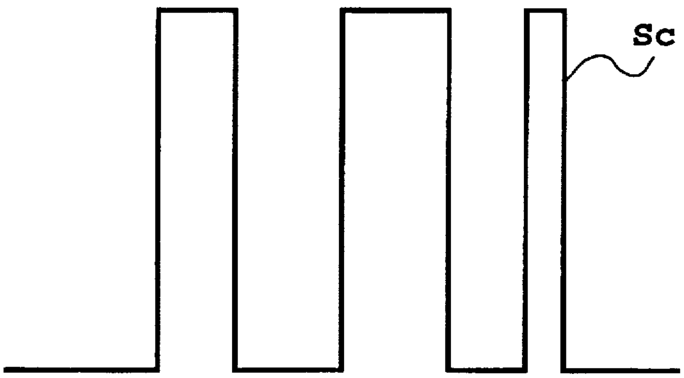
FIG. 12A is a waveform chart illustrating a waveform of the output Sc of the comparator 4 in FIG. 11.
Figure 12B:
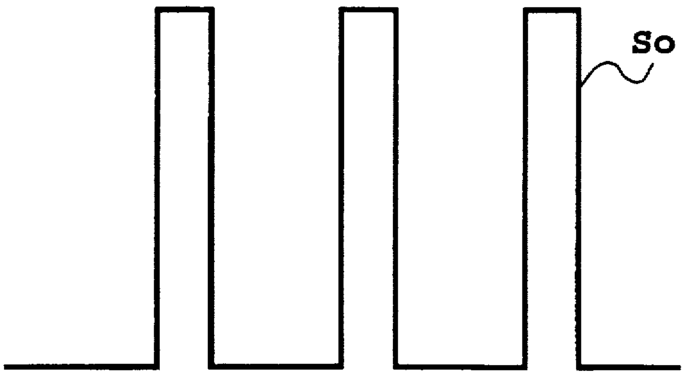
FIG. 12B is a waveform chart illustrating a waveform of the output So of the one-shot multivibrator in FIG. 11.

FIGS. 12A and 12B are timing diagrams illustrating the operation of the embodiment. FIG. 12A shows the output Sc of the comparator 4, in which the rising edges occur at a regular interval as in FIG. 4B. The one-shot multivibrator 18 is a logic circuit that outputs a fixed width pulse for each rising edge (or falling edge) of the input pulse. When a one-shot multivibrator changing its state at the rising edge is used as the one-shot multivibrator 18, the signal So produced from the output terminal 8 of FIG. 11 will take a waveform as shown in FIG. 12B.

The output So is a rectangular wave with a pulse width determined by the set condition of the one-shot multivibrator 18, and the frequency components of the output So include only the fundamental frequency given by equation (1) and its odd-order harmonics without any other spurious components. When a digital circuit is connected to the output terminal 8, the rectangular wave can be used without change.

A lowpass filter can be used to extract the fundamental component, or a bandpass filter can be employed to extract a desired harmonic as needed. In the third embodiment, the output frequency is twice that of the second embodiment shown in FIG. 8.

When the output Sc of the comparator 4 is a reversed version of FIG. 12A, one-shot multivibrator 18 is used which changes its state at a falling edge. In other words, the one-shot multivibrator 18 outputs one pulse at each timing at which the increasing accumulation value of the accumulator 1 reaches the reference voltage Vr.

EMBODIMENT 4

Figure 13:
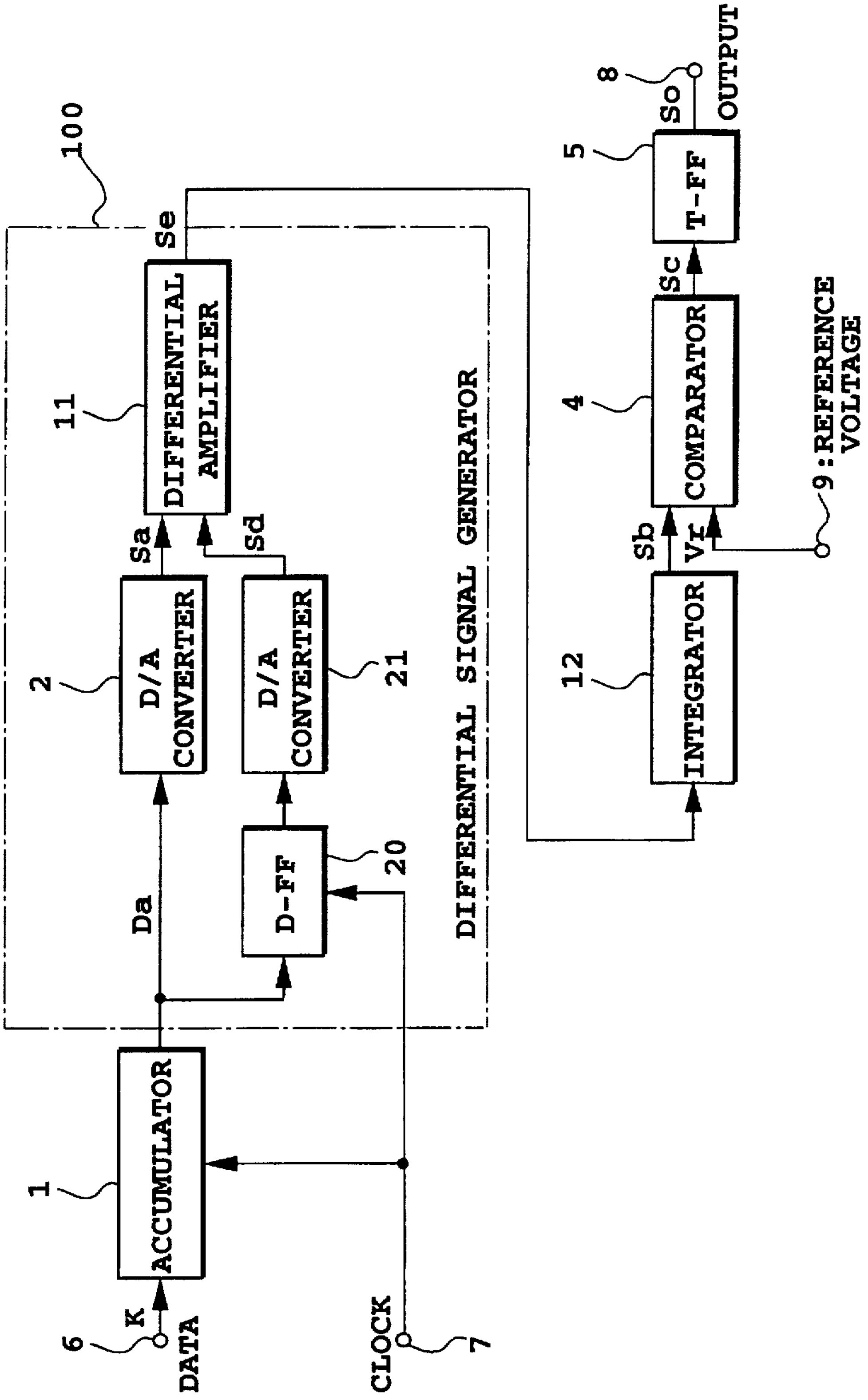
FIG. 13 is a block diagram showing a fourth embodiment of the direct digital synthesizer in accordance with the present invention.

FIG. 13 is a block diagram showing a fourth embodiment of the direct digital synthesizer in accordance with the present invention. In FIG. 13, the reference numeral 20 designates a delay flip-flop (D-FF), 21 designates a second D/A converter, and the other reference numerals designate the same portions as those in FIG. 8. The D-FF 20, the D/A converters 2 and 21, and the differential amplifier 11 constitute the differential signal generator 100. The D-FF is a logic circuit which maintains the logic state of the D-input at the instance of a rising edge until the next rising edge of the clock signal. Thus, the input to the D-FF is delayed by one clock interval, and is produced as the output.

Accordingly, the output of the D-FF 20 is a one clock interval delayed version of the output of the accumulator 1. Thus, the output Sa of the first D/A converter 2 takes a waveform as shown by the broken lines in FIG. 9A, whereas the output Sd of the second D/A converter 21 assumes a waveform as shown by the solid lines in FIG. 9A. As a result, a desired frequency can be obtained from the output terminal 8.

The differential amplifier 11 and the integrator 12 may be integrated into the differential integrator as shown in FIG. 10, and the T-FF 5 may be replaced with a one-shot multivibrator.

EMBODIMENT 5

Figure 14:
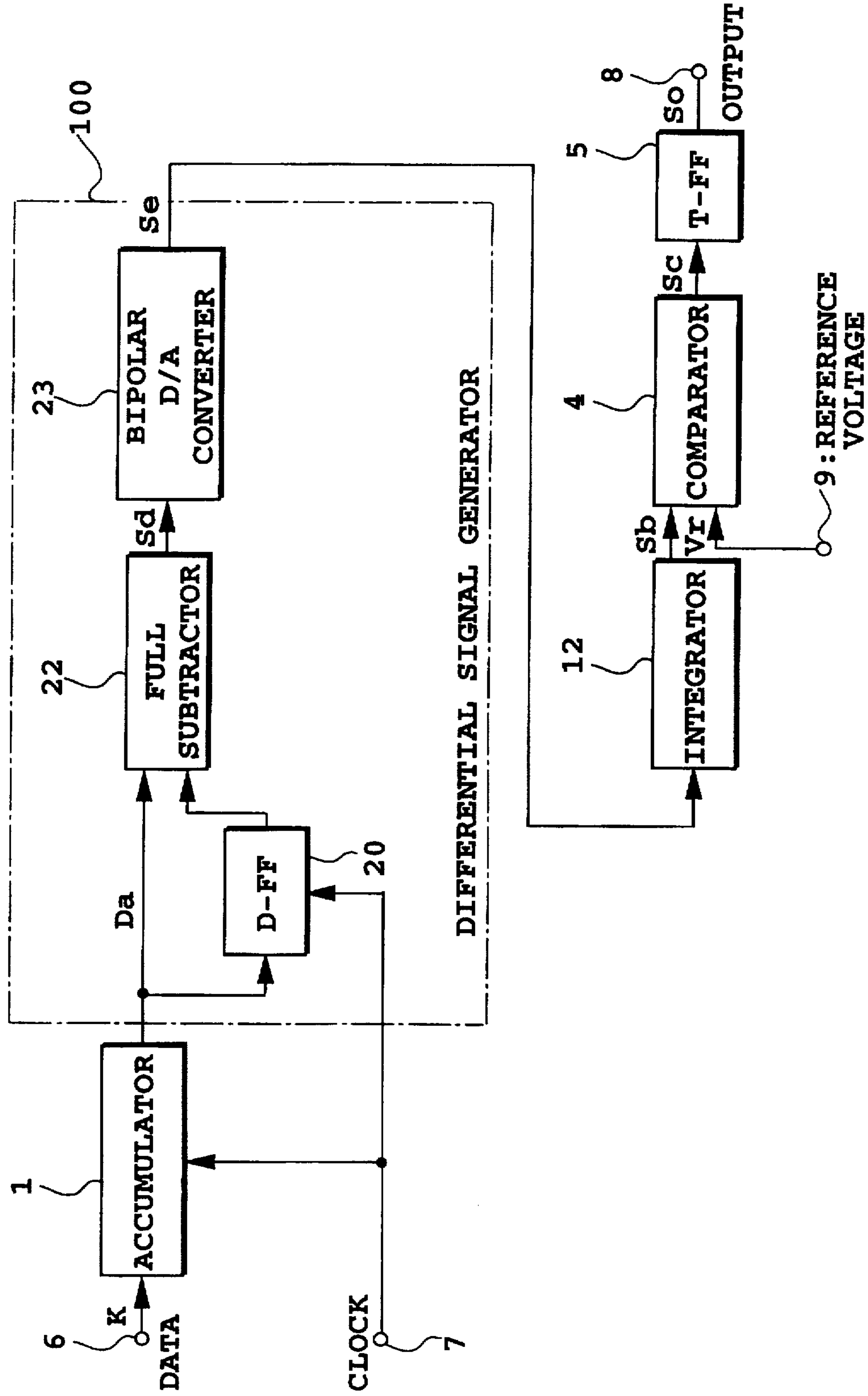
FIG. 14 is a block diagram showing a fifth embodiment of the direct digital synthesizer in accordance with the present invention.

FIG. 14 is a fifth embodiment of the direct digital synthesizer in accordance with the present invention. The fifth embodiment differs from the fourth embodiment in the following. First, the output Da of the accumulator 1 is fed to a first input terminal of a full subtractor 22, and the output of the D-FF 20 is supplied to a second input terminal of the full subtractor 22. Second, the output of the full subtractor 22 is fed to a bipolar D/A converter 23. Accordingly, the D/A converters 2 and 21 in the fourth embodiment are obviated. The D-FF 20, the full subtractor 22 and the D/A converter 23 constitute the differential signal generator 100.

The full subtractor is a logic circuit that carries out operation A–B for the input data A and B, and the bipolar D/A converter is a converter that outputs both plus and minus outputs. Accordingly, the output of the D/A converter 23 results in the same signal as shown in FIG. 9B. As a result, a desired frequency signal can be obtained from the output terminal 8.

Generally speaking, the full subtractor outputs a true difference when A≧B, and a 2's complement when A>B. The latter is a digital code termed 2's complement code (CTC). The bipolar D/A converter, on the other hand, generally uses an offset binary code (COB). The CTC can be easily converted into the COB by only reversing the MSB of the CTC.

The T-FF 5 may be replaced with a one-shot multivibrator.

EMBODIMENT 6

Figure 15:
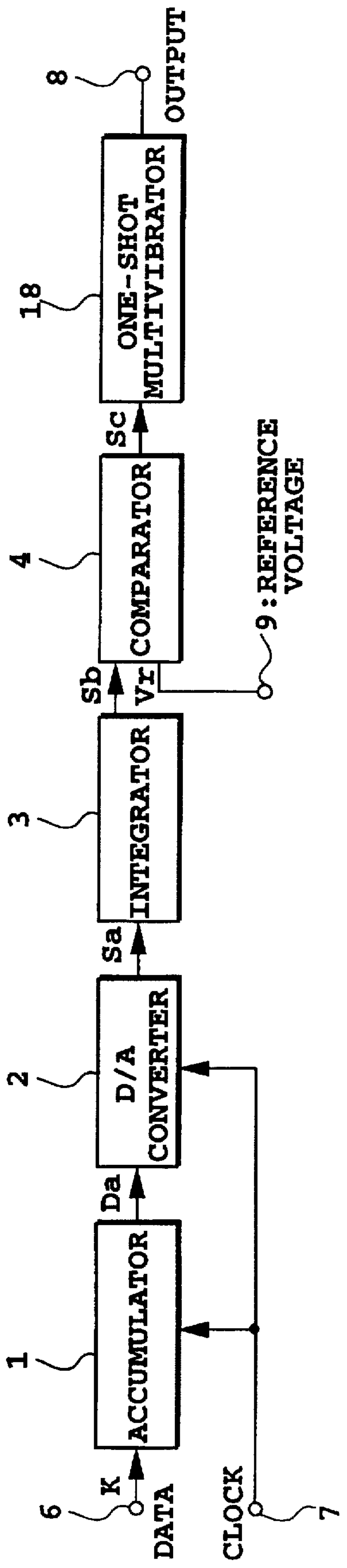
FIG. 15 is a block diagram showing a sixth embodiment of the direct digital synthesizer in accordance with the present invention.

FIG. 15 is a block diagram showing a sixth embodiment of the direct digital synthesizer in accordance with the present invention. The fifth embodiment differs from the first embodiment shown in FIG. 2 in that it employs the one-shot multivibrator 18 instead of the T-FF 5. The one-shot multivibrator 18 operates in the same manner as that of the third embodiment shown in FIG. 11.

EMBODIMENT 7

Figure 16:
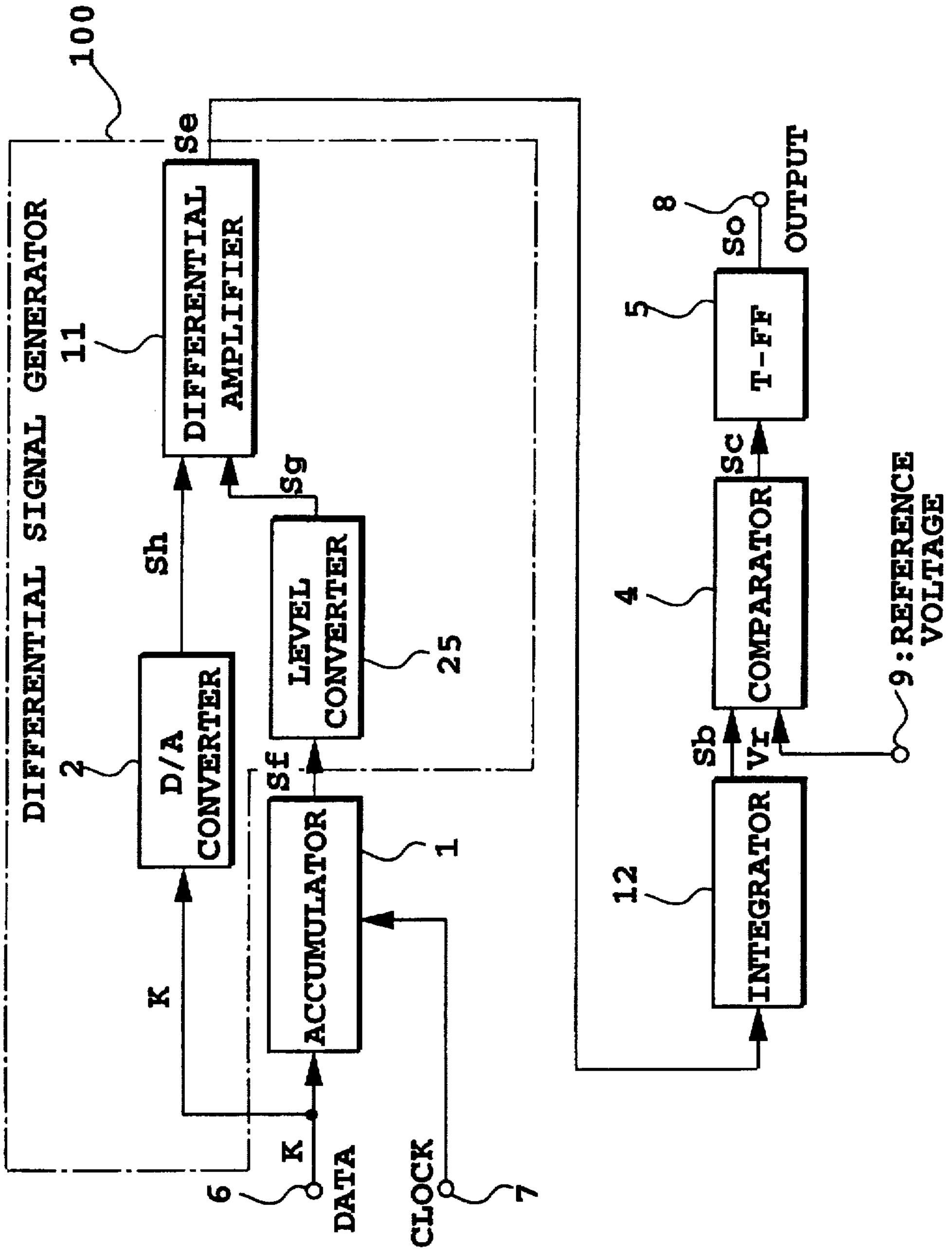
FIG. 16 is a block diagram showing a seventh embodiment of the direct digital synthesizer in accordance with the present invention.

FIG. 16 is a block diagram showing a seventh embodiment of the direct digital synthesizer in accordance with the present invention. In FIG. 16, the frequency control word K input to the input terminal 6 is fed to the accumulator 1 and the D/A converter 2. The overflow signal Sf produced from the accumulator 1 is level-converted by a level converter 25, and is fed to the second input terminal of the differential amplifier 11 as a signal Sg. On the other hand, the output Sh of the D/A converter 2 is fed to the first input terminal of the differential amplifier 11. The output Se of the differential amplifier 11 is supplied to the integrator 12. The D/A converter 2, the level converter 25 and the differential amplifier 11 constitute the differential signal generator 100.

FIGS. 17A–18B and FIG. 4A–4C are time charts illustrating the operation of this embodiment.

Figure 17A:
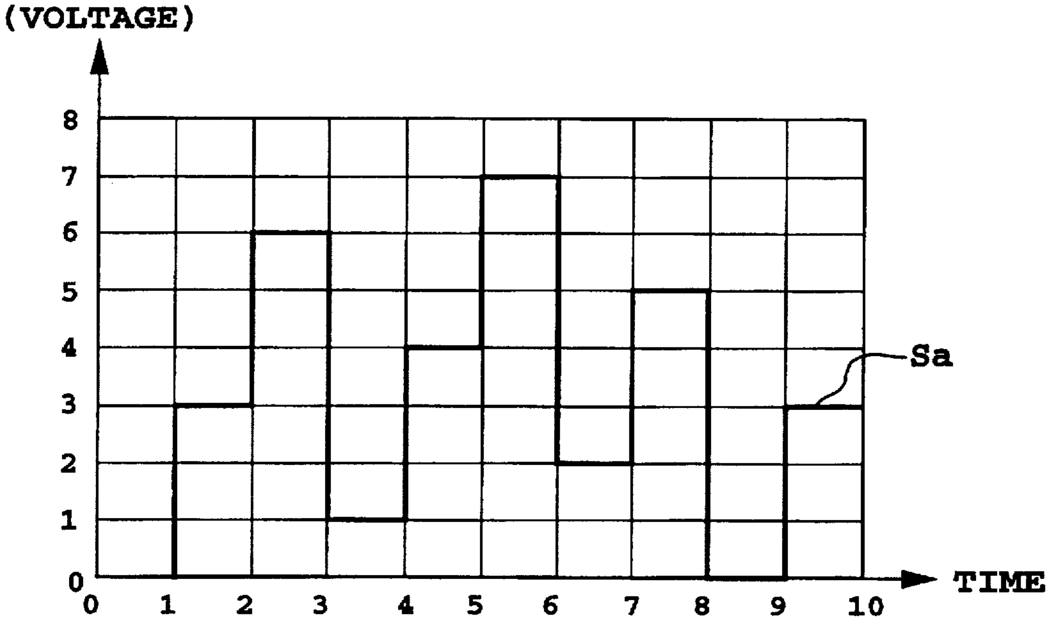
FIG. 17A is a waveform chart illustrating the waveform Sa when the content of the accumulator 1 of FIG. 16 is assumed to be converted into voltage.

The accumulator 1 will overflow at $2^3=8$ if it is a 3-bit accumulator. In addition, the accumulation value will increase such as 3 and 6 each time a clock pulse is input when the frequency control word K=3. Although the accumulation value would be expected to increase to 9 at the next clock pulse, it actually becomes 1 (=9–8) since the accumulator overflows at 8. Thus, the accumulator 1 restarts the accumulation from the initial value 1. If the accumulation value of the accumulator 1 is converted into a voltage, its waveform Sa would vary stepwise as shown in FIG. 17A. In FIG. 17A, the axis of abscissas represents the period of the clock signal, and the axis of ordinates represents the resolution of the accumulator 1 in terms of voltage. The staircase waveform Sa is quantized on the axis of ordinates, and varies its pulse width periodically on the axis of abscissas, thereby including large spurious components.

Figure 17B:
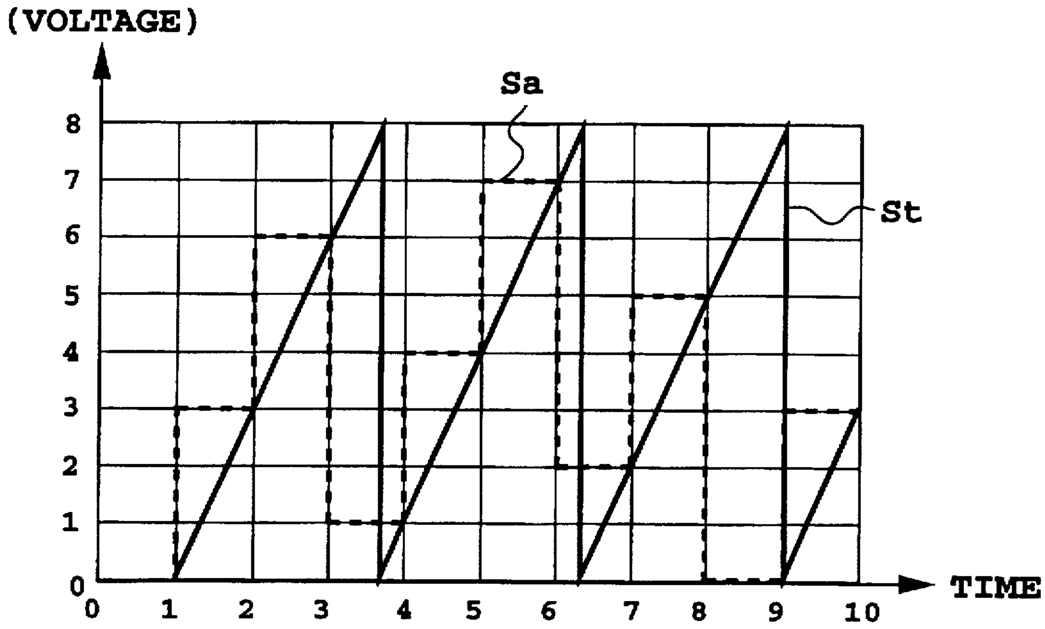
FIG. 17B is a waveform chart illustrating the imaginary sawtooth wave St obtained from the signal Sa in FIG. 17A.

As described before, the staircase waveform Sa varies along an imaginary sawtooth waveform St depicted by solid lines in FIG. 17B. The sawtooth waveform St is obtained by linking with a line the values of the staircase waveform Sa at clock pulse input timings, by extrapolating the line, and by returning the line to zero at timings when the line intersects the voltage line corresponding to $2^3=8$. The sawtooth waveform St includes three waves per eight clock periods, each having equal width on the time axis. This means that it includes only the fundamental frequency represented by the foregoing equation (1) and its harmonics without any other spurious components.

Figure 17C:
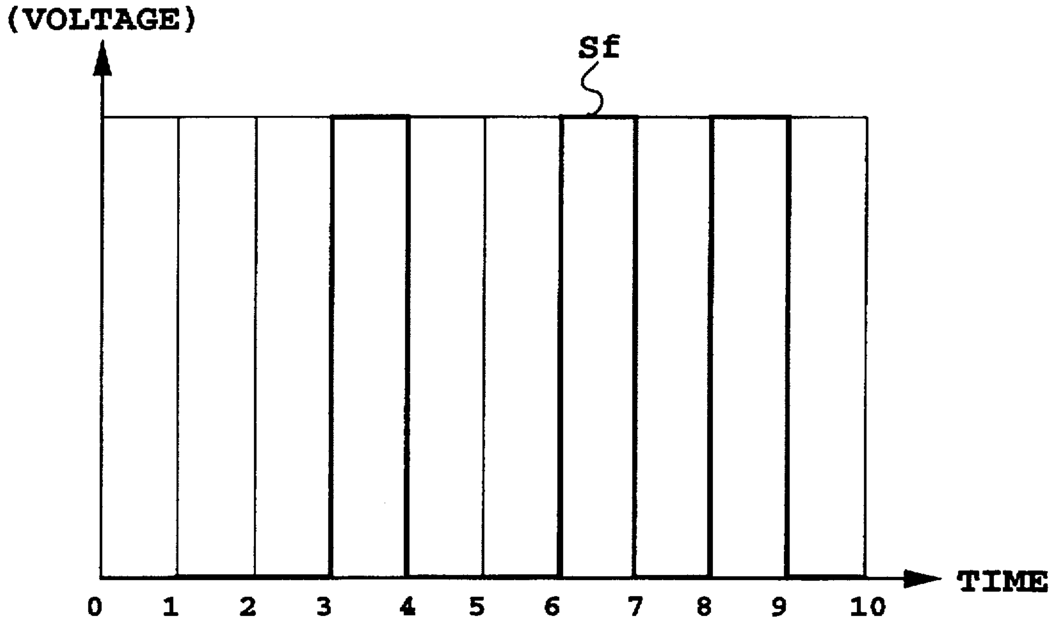
FIG. 17C is a waveform chart illustrating the waveform of the overflow signal Sf of the accumulator 1.

In FIG. 17C, the solid lines show the overflow signal Sf of the accumulator 1. The overflow signal Sf rises from low to high when the accumulator 1 overflows, and returns to low at the next clock pulse.

Figure 18A:
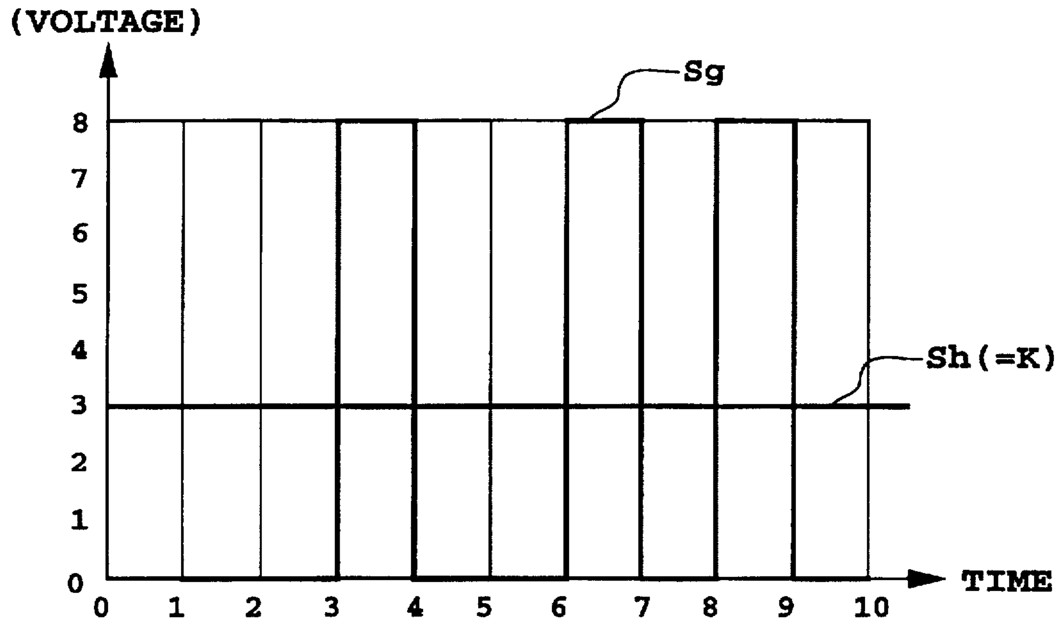
FIG. 18A is a waveform chart illustrating the waveforms of the output Sh of the D/A converter 2 and the output Sg of the level converter 25 in FIG. 16.

The amplitude and the DC level of the overflow signal Sf are converted by the level converter 25. FIG. 18A shows the output Sg of the level converter 25, and the output Sh of the D/A converter 2 which converts the frequency control word K to the analog voltage. A numeral (3 in this case) along the axis of ordinates in FIG. 18A represents the output voltage of the D/A converter 2 when the frequency control word K is input to the D/A converter 2. The DC output levels of the level converter 25 are determined as follows: When the overflow signal Sf is high, the DC output level of the level converter 25 is adjusted to the DC output level of the D/A converter 2 to which $2^3=8$ (digital code =1000) is input; and when the overflow signal Sf is low, it is adjusted to the DC output level of the D/A converter 2 to which 0 (digital code =0000) is input. This adjustment can be carried out as follows: First, the difference between the outputs of the D/A converter 2 is obtained when the voltages 8 and 0 are input thereto. Second, the difference between the outputs are divided by resistors or amplified by an amplifier such that the difference agrees with the difference between the high and low levels of the overflow signal Sf. Finally, the DC level of the level converter 25 is adjusted such that the levels of the two differences coincide with each other.

To practically input the data $2^n$ to the D/A converter 2, at least n+1-bit digital input terminals are needed. Actually, however, it is unnecessary to convert the data $2^n$ to an analog signal, and hence an n-bit D/A converter can be used which is required to convert the frequency control word K to an analog signal. This is because setting all bits of n-bit data to 1 is equivalent to inputting data $2^n-1$, and hence adding to this data a voltage corresponding to 1 LSB will provide the data that would be obtained when $2^n$ is input to the D/A converter 2.

Figure 18B:
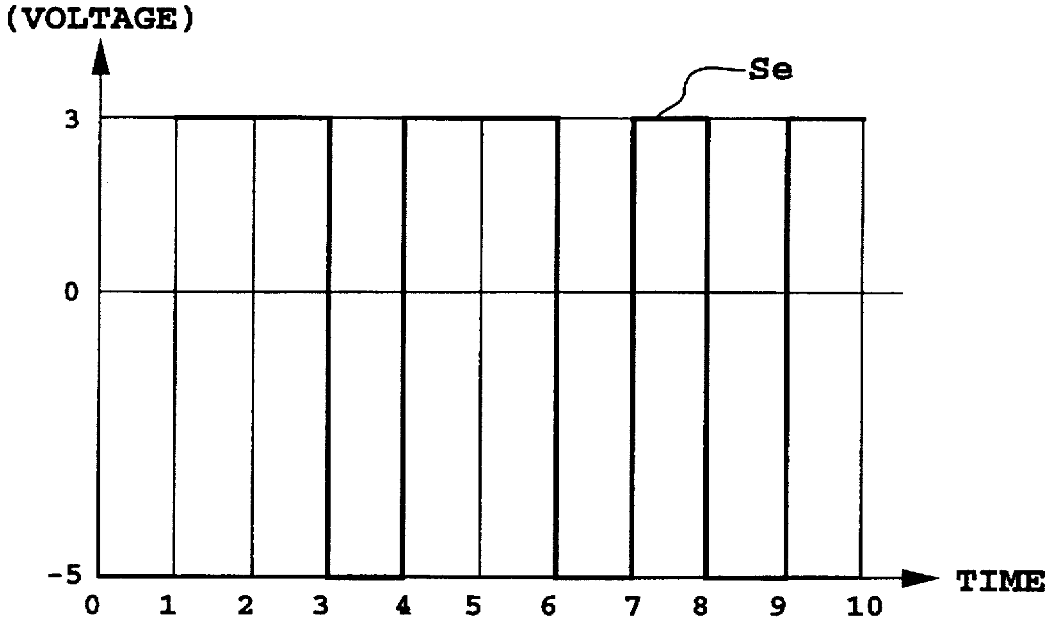
FIG. 18B is a waveform chart illustrating the waveform of the output Se of the differential amplifier 11 of FIG. 16.

FIG. 18B shows the output Se of the differential amplifier 11, that is, the output of the differential signal generator 100 when the amplification factor of the differential amplifier 11 is unity. As shown in this figure, the output Se alternately assumes the voltages corresponding to the analog voltages 3 and −5.

The output Se of the differential amplifier 11 is integrated with respect to time, resulting in the integral output Sb similar to that as shown in FIG. 4A. Here, the time constant of the integrator 12 is set such that an integral of voltage 1 is obtained when a fixed voltage 1 is integrated for a time 1. Therefore, the output voltage 3 of the differential amplifier 11 is integrated from time 1 to 3 to result in 6 at time 3, and then the output voltage −5 is added to the voltage 6 at the next time 4, resulting in voltage 1.

Comparing the output shown in FIG. 4A with the imaginary sawtooth wave in FIG. 17B, it is noticed that the two waveforms coincide with each other while the accumulation value of the accumulator 1 is increasing. Accordingly, a signal without spurious components can be obtained by using the time axis information while the output Sb of the integrator 12 is increasing.

Although the level converter 25 follows the accumulator 1 in FIG. 16, it may follow the D/A converter 2, or both the accumulator 1 and D/A converter 2.

The amplification factor of the differential amplifier 11 or the time constant of the integrator 12 is not limited to unity. Since the output voltage Sb of the integrator is proportional to the amplification factor or the time constant, the reference voltage Vr is set to match these values.

The two inputs to the differential amplifier 11, the subtrahend signal and the minuend signal, can be exchanged. In this case, the output of the differential amplifier 11 becomes symmetrical to the waveform Se as shown in FIG. 18B with respect to the axis of zero voltage, and hence the outputs of both the integrator 12 and the comparator 4 are inverted. Thus, since the output Sc of the comparator 4 is an inverted version of the waveform Sc as shown in FIG. 4B, a T-FF that operates at a falling edge must be used as the T-FF 5. In other words, the state of the T-FF is reversed at each timing when the output Sb of the integrator 12 reaches the reference voltage Vr while the accumulation value of the accumulator 1 is increasing.

Although the differential amplifier 11 and the integrator 12 are separated in the seventh embodiment, they can be integrated into a differential integrator as shown in FIG. 10.

EMBODIMENT 8

Figure 19:
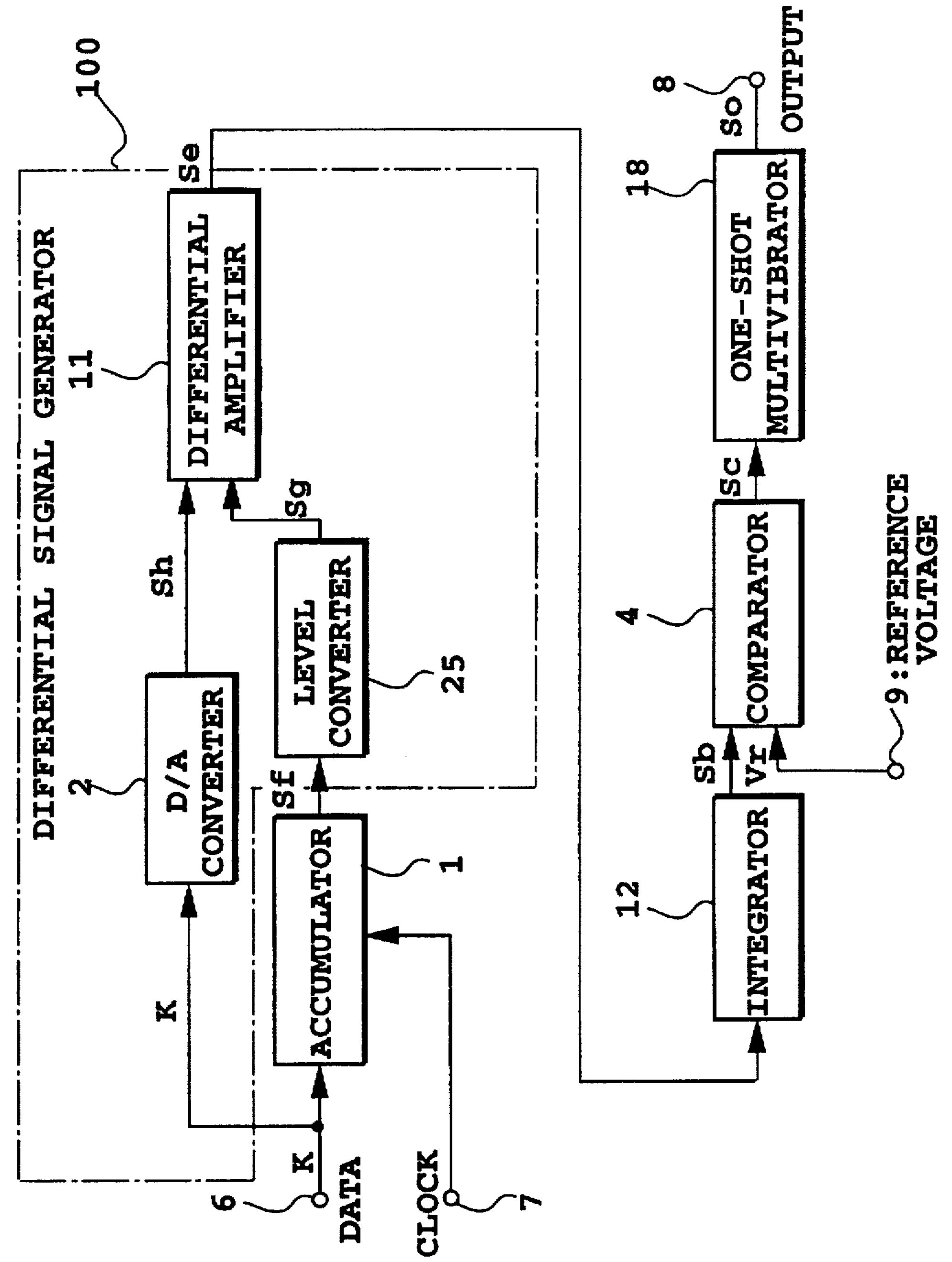
FIG. 19 is a block diagram showing an eighth embodiment of the direct digital synthesizer in accordance with the present invention.

FIG. 19 is a block diagram showing an eighth embodiment of the direct digital synthesizer in accordance with the present invention. The eighth embodiment differs from the seventh embodiment in that it employs the one-shot multivibrator 18 instead of the T-FF 5. Since this was explained in the third embodiment with reference to FIG. 11, the description thereof is omitted here.

EMBODIMENT 9

Figure 20:
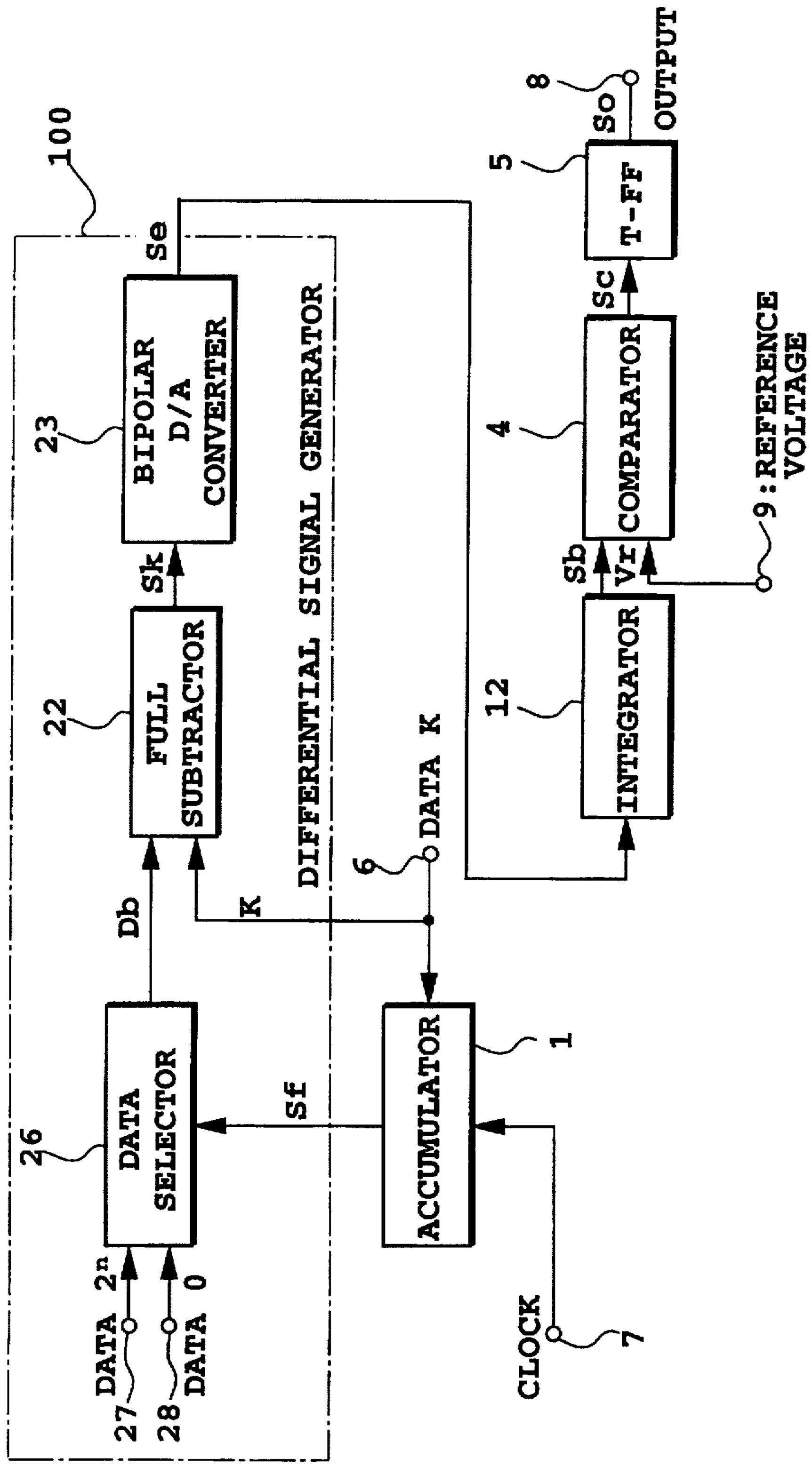
FIG. 20 is a block diagram showing a ninth embodiment of the direct digital synthesizer in accordance with the present invention.

FIG. 20 is a block diagram showing a ninth embodiment of the direct digital synthesizer in accordance with the present invention. The ninth embodiment differs from the fifth embodiment as shown in FIG. 14 in the following. First, the overflow signal Sf of the accumulator 1 is fed to a data selector 26, and the output of the data selector 26 is supplied to the first input terminal of the full subtractor 22. Second, the frequency control word K is input to the second input terminal of the full subtractor 22. Thus, the D-FF 20 in FIG. 14 is obviated. The data selector 26, the full subtractor 22 and the D/A converter 23 constitute the differential signal generator 100.

The data selector 26 is at least an n+1-bit selector, where n is the bit number of the accumulator 1, and the data $2^n$ and 0 are supplied to the input terminals 27 and 28 of the data selector 26, respectively. When n=3, the data supplied are $2^3=8$ (digital code 1000) and 0 (digital code 0000). The data selector 26 switches the two data in response to the level of the overflow signal Sf of the accumulator 1, and outputs one of them.

The output data Db of the data selector 26 and the frequency control word K are both input to the full subtractor 22. The subtractor 22 is a logic circuit that carries out the operation A−B for the input data A and B, and outputs the true difference when A≧B, and the 2's complement when A<B. Furthermore, the full subtractor 23 has a borrow terminal which outputs 0 when A≧B, and 1 when A<B. By placing the output of the borrow terminal at the MSB, the output of the full subtractor 22 forms a digital code called 2's complement code (CTC).

The bipolar D/A converter 23 can output both plus and minus analog voltages. The bipolar D/A converter generally uses an offset binary code (COB). The CTC can be easily converted into the COB by only reversing the MSB of the CTC.

Assuming that the frequency control word K=3 (digital code 011), and that the data selector 26 outputs data 0 (digital code 0000) when the overflow signal Sf of the accumulator 1 is low, and data 8 (digital code 1000) when the overflow signal Sf is high, the output Sk of the full subtractor 22 is 3 (digital code 00011) when the overflow signal Sf is low, and −5 (digital code 11011) when the overflow signal Sf is high. Here, the MSB of the output of the full subtractor 22 is the output of the borrow terminal representative of the sign. By inputting the output Sk of the full subtractor 22 to the bipolar D/A converter 23 with its MSB inverted, the D/A converter 23 outputs an analog voltage proportional to 3 when the overflow signal Sf is low, and an analog voltage proportional to −5 when the overflow signal Sf is high.

Thus, the output of the bipolar D/A converter 23, that is, the output Se of the differential signal generator 100 coincides with the signal shown in FIG. 18B. Accordingly, it is possible to obtain a desire frequency at the output terminal 8, and to obviate the periodic frequency variations to zero in principle.

EMBODIMENT 10

Figure 21:
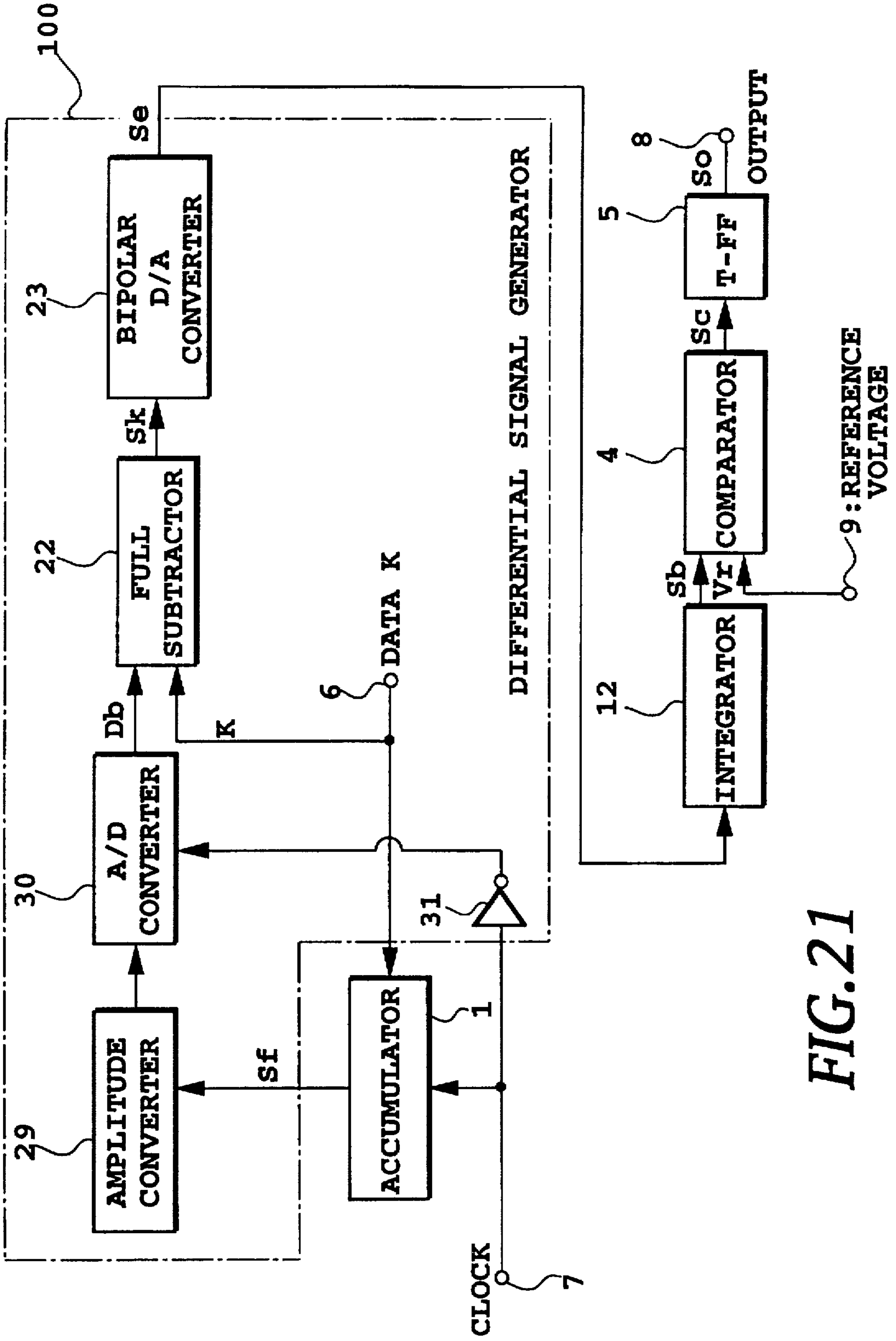
FIG. 21 is a block diagram showing a tenth embodiment of the direct digital synthesizer in accordance with the present invention.

FIG. 21 is a block diagram showing a tenth embodiment of the direct digital synthesizer in accordance with the present invention. The tenth embodiment differs from the ninth embodiment in that it is provided with an amplitude converter 29, an A/D converter 30 and an inverter 31 instead of the data selector 26. The amplitude converter 29, the A/D converter 30, the inverter 31, the full subtractor 22 and the D/A converter 23 constitute the differential signal generator 100.

The A/D converter 30 is at least an n+1-bit A/D converter, where n is the bit number of the accumulator 1. The A/D converter 30 switches the two data $2^n$ and 0 in response to the level of the overflow signal Sf of the accumulator 1, and outputs one of them. The amplitude converter 29 converts the amplitude of the overflow signal Sf such that data $2^n$ is output from the A/D converter 30 when the overflow signal Sf is high, and data 0 when the overflow signal Sf is low. The inverter 31 is provided for preventing a faulty operation, a coincidence of the changes in the logic level of the overflow signal Sf and the analog-to-digital conversion by the A/D converter 30. When both the accumulator 1 and the A/D converter 30 operate at the rising edges of the clock signal, the inverter 31 causes the A/D converter 30 to operate at the falling edges of the clock signal fed to the terminal 7. This will delay the timing of the analog-to-digital conversion by the A/D converter 30 by one pulse width of the clock signal from the timing of the logic level transition of the overflow signal Sf.

The input signals to the full subtractor 22 of the present embodiment coincide with those of the preceding embodiment as shown in FIG. 20. Accordingly, it is possible to obtain a desire frequency at the output terminal 8, and to obviate the periodic frequency variations to zero in principle.

The inverter 31 may be replaced with a delay circuit with a delay time shorter than the period of the clock signal.

In the ninth and tenth embodiments, the two inputs to the full subtractor 22, the subtrahend signal and the minuend signal, can be exchanged. In this case, the output of the bipolar D/A converter 23 becomes symmetrical to the waveform Se as shown in FIG. 18B with respect to the axis of zero voltage, and hence the outputs Sb and Sc of the integrator 12 and the comparator 4 are inverted. Thus, since the output Sc of the comparator 4 is an inverted version of the waveform Sc as shown in FIG. 4B, a T-FF that operates at a falling edge must be used as the T-FF 5. In other words, the state of the T-FF 5 is reversed at each timing when the output Sb of the integrator 12 reaches the reference voltage Vr while the accumulation value of the accumulator 1 is increasing.

The present invention has been described in detail with respect to various embodiments, and it will now be apparent from the foregoing to those skilled in the art that changes and modifications may be made without departing from the invention in its broader aspects, and it is the intention, therefore, in the appended claims to cover all such changes and modifications as fall within the true spirit of the invention.

What is claimed is:

1. A direct digital synthesizer comprising:

an accumulator for accumulating a frequency control word K each time a clock pulse is input, said accumulator continuing accumulation of said frequency control word K, when its accumulation value overflows, by setting an excess of the accumulation value over an accumulation limit of said accumulator as an initial value of said accumulator;

a differential signal generator for producing a signal corresponding to a difference between a current output of said accumulator and an output of said accumulator preceding said current output by one clock pulse;

an integrator for integrating the signal produced by said differential signal generator;

a comparator for comparing an output of said integrator with a predetermined reference voltage to produce a pulsed output; and a pulse generator for generating a pulse in synchronism with one of a rising edge and a falling edge of said pulsed output of said comparator while the accumulation value of said accumulator is rising;

wherein said differential signal generator includes a D/A converter for converting said accumulation value of said accumulator to an analog signal, a delay circuit for delaying an output of said D/A converter, and a differential amplifier to which said output of said D/A converter and an output of said delay circuit are input.

2. The direct digital synthesizer as claimed in claim 1, wherein said differential amplifier and said integrator are incorporated into a differential integrator.

3. The direct digital synthesizer as claimed in claim 1, wherein said accumulator is an n-bit accumulator which produces an overflow signal when said differential accumulation value grows equal to or greater than $2^n$, and said signal generator comprises a differential signal generator for switching a voltage proportional to said frequency control word K and a voltage proportional to $K-2^n$ to produce one of them in response to a level of said overflow signal of said accumulator, and an integrator for time integrating an output of said differential signal generator.

4. The direct digital synthesizer as claimed in claim 1, wherein said pulse generator comprises a toggle flip-flop.

5. The direct digital synthesizer as claimed in claim 1, wherein said pulse generator comprises a one-shot multivibrator.

6. A direct digital synthesizer comprising:

an accumulator for accumulating a frequency control word K each time a clock pulse is input, said accumulator continuing accumulation of said frequency control word K, when its accumulation value overflows, by setting an excess of the accumulation value over an accumulation limit of said accumulator as an initial value of said accumulator;

a differential signal generator for producing a signal corresponding to a difference between a current output of said accumulator and an output of said accumulator preceding said current output by one clock pulse;

an integrator for integrating the signal produced by said differential signal generator;

a comparator for comparing an output of said integrator with a predetermined reference voltage to produce a pulsed output; and a pulse generator for generating a pulse in synchronism with one of a rising edge and a falling edge of said pulsed output of said comparator while the accumulation value of said accumulator is rising;

wherein said differential signal generator includes a first D/A converter for converting said accumulation value of said accumulator to an analog signal, a delay flip-flop for delaying said accumulation value of said accumulator by one clock interval of said clock signal, a second D/A converter for converting an output of said delay flip-flop into an analog signal, and a differential amplifier to which an output of said first D/A converter and an output of said second D/A converter are input.

7. The direct digital synthesizer as claimed in claim 6, wherein said differential amplifier and said integrator are incorporated into a differential integrator.

8. A direct digital synthesizer comprising:

an accumulator for accumulating a frequency control word K each time a clock pulse is input, said accumulator continuing accumulation of said frequency control word K, when its accumulation value overflows, by setting an excess of the accumulation value over an accumulation limit of said accumulator as an initial value of said accumulator;

a differential signal generator for producing a signal corresponding to a difference between a current output of said accumulator and an output of said accumulator preceding said current output by one clock pulse;

an integrator for integrating the signal produced by said differential signal generator;

a comparator for comparing an output of said integrator with a predetermined reference voltage to produce a pulsed output; and a pulse generator for generating a pulse in synchronism with one of a rising edge and a falling edge of said pulsed output of said comparator while the accumulation value of said accumulator is rising;

wherein said differential signal generator includes a delay flip-flop for delaying said accumulation value of said accumulator by one clock interval of said clock signal, a full subtractor for obtaining a difference between said accumulation value of said accumulator and an output of said delay flip-flop, and a D/A converter for converting an output of said full subtractor to an analog signal.

9. A direct digital synthesizer comprising:

an accumulator for accumulating a frequency control word K each time a clock pulse is input, said accumulator continuing accumulation of said frequency control word K, when its accumulation value overflows, by setting an excess of the accumulation value over an accumulation limit of said accumulator as an initial value of said accumulator;

a differential signal generator for producing a signal corresponding to a difference between a current output of said accumulator and an output of said accumulator preceding said current output by one clock pulse;

an integrator for integrating the signal produced by said differential signal generator;

a comparator for comparing an output of said integrator with a predetermined reference voltage to produce a pulsed output; and a pulse generator for generating a pulse in synchronism with one of a rising edge and a falling edge of said pulsed output of said comparator while the accumulation value of said accumulator is rising;

wherein said accumulator is an n-bit accumulator which produces an overflow signal when said differential accumulation value grows equal to or greater than $2^n$, and said signal generator comprises a differential signal generator for switching a voltage proportional to said frequency control word K and a voltage proportional to $K-2^n$ to produce one of them in response to a level of said overflow signal of said accumulator, and an integrator for time integrating an output of said differential signal generator;

wherein said differential signal generator comprises:

a D/A converter for converting said frequency control word K to an analog signal;

a level converter for converting the level of said overflow signal of said accumulator such that a DC (direct current) level of an output of said level converter becomes equal, when said overflow signal is high, to a DC level of an output of said D/A converter to which data $2^n$ is input, and becomes equal, when said overflow signal is low, to the DC level of the output of said D/A converter to which data 0 is input; and a differential amplifier to which the output of said D/A converter and an output of said level converter are input.

10. The direct digital synthesizer as claimed in claim 9, wherein said differential amplifier and said integrator are incorporated into a differential integrator.

11. A direct digital synthesizer comprising:

an accumulator for accumulating a frequency control word K each time a clock pulse is input, said accumulator continuing accumulation of said frequency control word K, when its accumulation value overflows, by setting an excess of the accumulation value over an accumulation limit of said accumulator as an initial value of said accumulator;

a differential signal generator for producing a signal corresponding to a difference between a current output of said accumulator and an output of said accumulator preceding said current output by one clock pulse;

an integrator for integrating the signal produced by said differential signal generator;

a comparator for comparing an output of said integrator with a predetermined reference voltage to produce a pulsed output; and a pulse generator for generating a pulse in synchronism with one of a rising edge and a falling edge of said pulsed output of said comparator while the accumulation value of said accumulator is rising;

wherein said accumulator is an n-bit accumulator which produces an overflow signal when said differential accumulation value grows equal to or greater than $2^n$, and said signal generator comprises a differential signal generator for switching a voltage proportional to said frequency control word K and a voltage proportional to $K-2^n$ to produce one of them in response to a level of said overflow signal of said accumulator, and an integrator for time integrating an output of said differential signal generator;

wherein said differential signal generator comprises:

a data selector for switching data corresponding to $2^n$ and data corresponding to 0 to produce one of them in response to the level of said overflow signal of said accumulator;

a full subtractor for producing a difference between output data of said data selector and said frequency control word K; and a D/A converter for converting an output of said full subtractor to an analog signal.

12. A direct digital synthesizer comprising:

an accumulator for accumulating a frequency control word K each time a clock pulse is input, said accumulator continuing accumulation of said frequency control word K, when its accumulation value overflows, by setting an excess of the accumulation value over an accumulation limit of said accumulator as an initial value of said accumulator;

a differential signal generator for producing a signal corresponding to a difference between a current output of said accumulator and an output of said accumulator preceding said current output by one clock pulse;

an integrator for integrating the signal produced by said differential signal generator;

a comparator for comparing an output of said integrator with a predetermined reference voltage to produce a pulsed output; and a pulse generator for generating a pulse in synchronism with one of a rising edge and a falling edge of said pulsed output of said comparator while the accumulation value of said accumulator is rising;

wherein said accumulator is an n-bit accumulator which produces an overflow signal when said differential accumulation value grows equal to or greater than $2^n$, and said signal generator comprises a differential signal generator for switching a voltage proportional to said frequency control word K and a voltage proportional to $K-2^n$ to produce one of them in response to a level of said overflow signal of said accumulator, and an integrator for time integrating an output of said differential signal generator;

wherein said differential signal generator comprises:

an A/D converter for producing one of data corresponding to $2^n$ and data corresponding to 0 in response to the level of said overflow signal of said accumulator;

a full subtractor for producing a difference between output data of said A/D converter and said frequency control word K; and a D/A converter for converting an output of said full subtractor to an analog signal.

13. The direct digital synthesizer as claimed in claim 12, further comprising an amplitude converter connected between said accumulator and said A/D converter for converting the level of said overflow signal of said accumulator.

14. The direct digital synthesizer as claimed in claim 13, further comprising an inverter whose input is connected to said clock signal and whose output is connected to a clock input terminal of said A/D converter.

* * * * *